US006996382B2

(12) United States Patent
Higuchi

(10) Patent No.: US 6,996,382 B2
(45) Date of Patent: Feb. 7, 2006

(54) TRANSMISSION OUTPUT POWER CONTROL DEVICE FOR USE IN A BURST TRANSMITTER AND CONTROL METHOD

(75) Inventor: Koji Higuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 561 days.

(21) Appl. No.: 10/194,319

(22) Filed: Jul. 15, 2002

(65) Prior Publication Data

US 2003/0114124 A1 Jun. 19, 2003

(30) Foreign Application Priority Data

Dec. 13, 2001 (JP) ....................................... 2001-379562

(51) Int. Cl.
*H04B 1/04* (2006.01)

(52) U.S. Cl. ......................... 455/126; 455/68; 455/108; 375/297

(58) Field of Classification Search .............. 455/127.1, 455/127.2, 127.3, 127.4, 136, 137, 138, 522, 455/67.11, 67.13, 68, 69, 108, 109, 115.1, 455/114.3, 126; 375/297, 298
See application file for complete search history.

(56) References Cited

U.S. PATENT DOCUMENTS 4,523,155 A 6/1985 Walczak et al.

FOREIGN PATENT DOCUMENTS

| | | | |
|---|---|---|---|
| EP | 0 434 294 | A | 6/1991 |
| EP | 0 533 395 | A1 | 3/1993 |
| EP | 0 688 109 | A2 | 12/1995 |
| JP | 5-129860 | | 5/1993 |
| JP | 6-53919 | | 2/1994 |
| JP | 10-23089 | | 1/1998 |

*Primary Examiner*—Edward F. Urban
*Assistant Examiner*—Thuan T. Nguyen
(74) *Attorney, Agent, or Firm*—Oblon, Spivak, McClelland, Maier & Neustadt, P.C.

(57) ABSTRACT

A burst transmitter is obtained which, when a constant envelope modulation is used, can control the envelope of a transmission output power by controlling a baseband signal without causing the spreading of the spectrum. A transmission output power control device includes: an I/Q signal amplitude control unit (101) for variably controlling the shape of a rise and a fall of the waveform of a baseband signal and its burst transmission time from the end of the rise to the beginning of the fall in accordance with a modulation system signal; a modulating unit (2003) for modulating the baseband signal controlled in the I/Q signal amplitude control unit (101) into a high-frequency signal for transmission in accordance with the modulation system signal; an amplifier (2004) for amplifying the transmission high-frequency signal modulated in the modulating unit (2003); and a control voltage signal selecting unit (102) for outputting a predetermined constant voltage which is determined by the modulation system signal and a transmission power level signal, so as to control the output power of the amplifier.

12 Claims, 23 Drawing Sheets

FIG. 8

| PCL | Ta | Tb | Tc | STORED RAMP AMPLITUDE WAVEFORM VGiq |
|---|---|---|---|---|
| 3 | 0.05 | 0.90 | 0.05 | VGiq5[0]~[5] |
| 2 | 0.07 | 0.86 | 0.07 | VGiq7[0]~[7] |
| 1 | 0.10 | 0.80 | 0.10 | VGiq10[0]~[10] |
| 0 | 0.15 | 0.70 | 0.15 | VGiq15[0]~[15] |

※TIME RATIO AMONG Ta, Tb, Tc WITH TRANSMISSION SLOT TIME ASSUMED TO BE 1.00

FIG. 12

| PCL | TEMPERATURE | Ta | Tb | Tc | STORED RAMP AMPLITUDE WAVEFORM VGiq |
|---|---|---|---|---|---|
| ... | | | | | |
| 2 | LOW | 0.06 | 0.88 | 0.06 | VGiq6[0]~[6] |
| | MID | 0.07 | 0.86 | 0.07 | VGiq7[0]~[7] |
| | HIGH | 0.08 | 0.82 | 0.08 | VGiq8[0]~[8] |
| ... | | | | | |

※TIME RATIO AMONG Ta, Tb, Tc WITH TRANSMISSION SLOT TIME ASSUMED TO BE 1.00

FIG. 14

| PCL | POWER-SUPPLY VOLTAGE | Ta | Tb | Tc | STORED RAMP AMPLITUDE WAVEFORM VGiq |
|---|---|---|---|---|---|
| ... | | | | | |
| 2 | HIGH | 0.06 | 0.88 | 0.06 | VGiq6[0]~[6] |
| | MID | 0.07 | 0.86 | 0.07 | VGiq7[0]~[7] |
| | LOW | 0.08 | 0.82 | 0.08 | VGiq8[0]~[8] |
| ... | | | | | |

※TIME RATIO AMONG Ta, Tb, Tc WITH TRANSMISSION SLOT TIME ASSUMED TO BE 1.00

SELECT SIGNAL IN ELECTRIC MATCHING ADJUSTING CIRCUIT

| MODULATION SYSTEM | TRANSMISSION POWER LEVEL SIGNAL PCL (MAGNITUDE OF TRANSMISSION OUTPUT POWER) | SELECT SIGNAL |
|---|---|---|
| AMPLITUDE MODULATION 0 | 0～1 (LARGE), | 1 |
| AMPLITUDE MODULATION 0 | 2～3 (SMALL) | 0 |
| CONSTANT ENVELOPE MODULATION 1 | 0～3 (LARGE), | 1 |
| CONSTANT ENVELOPE MODULATION 1 | 4～5 (SMALL) | 0 |

FIG. 19

| NONLINEARITY ΔV | Ta | Tb | Tc | STORED RAMP AMPLITUDE WAVEFORM VGiq |
|---|---|---|---|---|
| 0 SMALL | 0.05 | 0.90 | 0.05 | VGiq5[0]~[5] |
| +1 | 0.07 | 0.86 | 0.07 | VGiq7[0]~[7] |
| +2 | 0.10 | 0.80 | 0.10 | VGiq10[0]~[10] |
| +3 LARGE | 0.15 | 0.70 | 0.15 | VGiq15[0]~[15] |

※TIME RATIO AMONG Ta, Tb, Tc WITH TRANSMISSION SLOT TIME ASSUMED TO BE 1.00

TRANSMISSION OUTPUT POWER CONTROL DEVICE FOR USE IN A BURST TRANSMITTER AND CONTROL METHOD

BACKGROUND OF THE INVENTION

1. Field of the Invention

The present invention relates to a transmission output power control device and a transmission output power control method for use in a burst transmitter.

2. Description of the Background Art

Considering the recent increase in the number of users of cellular phone terminals, it is desirable to make as high as possible the efficiency of use of the frequency bands in the cellular phone system etc. In a burst transmitter used in the cellular phone terminal, in order to efficiently utilize the frequency band, the output power for transmission is ramped so that it rises and falls slowly, thereby preventing the spectrum from spreading in a wide range. The cellular phone system complexly uses a plurality of radio systems which use different communication systems, and the different systems use different types of modulation. Thus the cellular phone terminals include so-called dual-mode terminals which have two modulation systems.

FIG. 20 is a block diagram that shows the configuration of a dual-mode burst transmitter that uses an amplitude modulation system e.g. PDC (Personal Digital Cellular) or CDMA (Code Division Multiple Access), and a constant envelope modulation system, e.g. GSM (Global System for Mobile Communication). This configuration is now described. An I/Q signal amplitude control unit 2001 is connected via baseband signal D/A converters 2002 to a modulating unit 2003, and the modulating unit 2003 is connected to a power amplifier 2004 serving as amplifying means. The power amplifier 2004 is connected to an antenna 2005 and also to a control voltage signal selecting unit 2007 via a control voltage signal D/A converter 2006.

The I/Q signal amplitude control unit 2001 includes a waveform data generating portion 2008 and multiplication mixers 2009 connected to each other, and the waveform data generating portion 2008 includes a serial connection of a counter 2010, a table reference number generating portion 2011, and a ramp amplitude waveform data memory 2012. The modulating unit 2003 includes a quadrature modulator 2013 and a local oscillator 2014 connected to each other. The control voltage signal selecting unit 2007 includes a waveform data control function portion 2015 and a ramp amplitude waveform data memory 2016 connected thereto.

Next, its operation is described referring to FIGS. 20, 21A, and 21B. First, when a modulation system signal Sm from a base station of the radio network (for example, Sm=0 for the amplitude modulation and Sm=1 for the constant envelope modulation) selects the amplitude modulation system (Sm=0), the configuration operates as shown below. Digital baseband signals I and Q are ramped in the I/Q signal amplitude control unit 2001 and then the ramped digital baseband signals I and Q are converted to analog signals in the baseband signal D/A converters 2002. Their output amplitude waveform is shown as an analog baseband signal Ia and Qa in FIG. 21A. The ramping process performed in the I/Q signal amplitude control unit 2001 will be fully described later.

Next, in the modulating unit 2003, the ramped analog baseband signals Ia and Qa are quadrature-modulated in the quadrature modulator 2013 with a high-frequency signal outputted from the local oscillator 2014 and are thus converted to a high-frequency signal to be transmitted. The high-frequency signal outputted from the local oscillator 2014 has a frequency that is used in the amplitude modulation system selected by the base station. The high-frequency signal to be transmitted is amplified in the power amplifier 2004 and transmitted as a transmission output P from the antenna 2005. In this process, the control voltage signal selecting unit 2007 receives as its inputs the modulation system signal Sm and a transmission power level signal PCL (0, 1, . . . n) which indicates the level of the transmission power specified from the base station, and the waveform data control function portion 2015 causes digital data which corresponds to the modulation system signal Sm and the transmission power level signal PCL to be sent from the ramp amplitude waveform data memory 2016 to the control voltage signal D/A converter 2006. The control voltage signal D/A converter 2006 converts the incoming digital data to an analog signal, and during the transmission, it keeps outputting to the power amplifier 2004 a power amplifier control voltage Vc (Vc0 to Vcn) which has a predetermined constant voltage as shown in FIG. 21A. A constant voltage is thus outputted during a burst transmission section.

Now, the ramp process performed in the I/Q signal amplitude control unit 2001 is described in detail. Suppose that the modulation system signal Sm inputted to the waveform data generating portion 2008 indicates the amplitude modulation (Sm=0). Then, in the waveform data generating portion 2008, the counter 2010, configured on the basis of a clock, starts counting upon application of a transmission start pulse. As the counter 2010 is counting up, the table reference number generating portion 2011 specifies table reference numbers, n, for reading I/Q amplitude values Vpiq[n] on a table for use in ramp up. When the table reference numbers n are specified, then the I/Q amplitude values VPiq[n] corresponding to the table reference numbers n are read from the ramp amplitude waveform data memory 2012.

FIG. 22 shows, in the form of an analog signal, a ramp amplitude waveform VPiq used in the ramping process when the amplitude modulation is selected. The ramp amplitude waveform is composed of a collection of data which is required to perform the ramping process. In particular, a ramp amplitude waveform for ramping the baseband signal is represented as Viq. For the ramp amplitude waveform Viq, a ramp amplitude waveform for use in the amplitude modulation is represented as VPiq and that for use in the constant envelope modulation is represented as VGiq. When the ramping process is performed as shown in FIG. 21A, the ramp up portion exhibits such a waveform as shown in this diagram. The values VPiq[n] that form the ramp amplitude waveform VPiq are the I/Q amplitude values that correspond to the table reference numbers n; six values are set herein for the rising ramp process.

The multiplication mixers 2009 multiplies the I/Q amplitude values VPiq[n] outputted from the waveform data generating portion 2008 and the digital baseband signals I and Q to produce ramped digital baseband signals I and Q. In the amplitude modulation system, nonlinearity is not produced so much between the digital baseband signals I and Q and the transmission output P, so that the I/Q amplitude values VPiq[n] outputted from the waveform data generating portion 2008 can hold a given fixed pattern.

Next, when the constant envelope modulation is selected by the modulation system signal Sm from the radio network base station (Sm=1), the configuration operates as shown below. In the case of the constant envelope modulation, nonlinear circuitry is often used between the digital baseband signals I, Q and the transmission output P; therefore nonlinearity is produced. Accordingly the ramping process for the transmission output P is performed not in the I/Q signal amplitude control unit 2001 but in the control voltage signal selecting unit 2007 which outputs the control voltage signal Vc for controlling the power amplifier 2004. Therefore the digital baseband signals I and Q are outputted from the I/Q signal amplitude control unit 2001 without undergoing ramp process. The digital baseband signals I and Q from the I/Q signal amplitude control unit 2001 are converted to analog signals in the baseband signal D/A converters 2002 and outputted therefrom. As shown in FIG. 21B as an analog baseband signal Ia and Qa in the constant envelope modulation, the outputs exhibit an amplitude waveform having a constant amplitude that rises and falls vertically.

The analog baseband signals Ia and Qa are quadrature-modulated in the quadrature modulator 2013 in the modulating unit 2003 with the high-frequency signal from the local oscillator 2014, and are thus converted to a high-frequency signal to be transmitted. The high-frequency signal outputted from the local oscillator 2014 has a frequency that is used in the constant envelope modulation system selected by the base station. The transmission high-frequency signal outputted from the modulating unit 2003 is amplified in the power amplifier 2004 and transmitted as the transmission output P from the antenna 2005. In this process, the control voltage signal selecting unit 2007 receives as its inputs the modulation system signal Sm (Sm=1) and the transmission power level signal PCL. Then, in the control voltage signal selecting unit 2007, the waveform data control function portion 2015 reads a ramp amplitude waveform corresponding to these signals from the ramp amplitude waveform data memory 2016 and outputs the digital control voltage data for that ramp amplitude waveform to the control voltage signal D/A converter 2006 in synchronization with a transmission timing clock. On the basis of the digital data input corresponding to the transmission power level signal PCL, the control voltage signal D/A converter 2006 generates the control voltage Vc (Vc0 to Vcn) for controlling the power amplifier 2004; the control voltage Vc slowly rises and falls as shown in FIG. 21B. The control voltage signal D/A converter 2006 then outputs the control voltage Vc to the power amplifier 2004, so as to control the transmission output P into a smooth waveform so that the spectrum will not spread in a wide range.

As shown above, when the constant envelope modulation system is selected, the conventional technique realizes the ramping process by controlling the control voltage Vc to the power amplifier 2004. In this case, since the characteristics of the power amplifier 2004 differ in different radio devices, it is impossible to initially set a table for controlling the power amplifier, so that the table must be stored in a rewritable storage, i.e. in the memory 2016. Also, when the constant envelope modulation is selected, the control voltage signal Vc must be varied in accordance with the level indicated by the transmission power level signal PCL, and the ramping process must be applied to the varied version of the control voltage signal Vc. Accordingly, it is necessary to store different ramp amplitude waveforms for the control voltage Vc in correspondence with the individual levels of the transmission power level signal PCL. Therefore, a large amount of data must be stored in the ramp amplitude waveform data memory 2016 and the control voltage signal D/A converter 2006 must be controlled each time a transmission is made, which requires an increased amount of processing and increased consumption of power.

Furthermore, the ramping process must be conducted in different places depending on whether the amplitude modulation is selected or the constant envelope modulation is selected. Hence the modulation systems require their respective ramp amplitude waveform data memories and their respective operation procedures, which also requires increased consumption of power.

SUMMARY OF THE INVENTION

A first object of the present invention is, in a burst transmitter using a constant envelope modulation, to reduce the amount of memory, the amount of processing, and the consumption of power required for a ramp process to the transmission output power.

A second object of the invention is to perform the ramp process in such a way as to more effectively suppress the spreading of the spectrum of the transmission output power.

A third object of the invention is to reduce the amount of processing and the consumption of power and to suppress the spreading of the spectrum.

According to a first aspect of the present invention, in a burst transmitter using a constant envelope modulation system, a transmission output power control device includes an I/Q signal amplitude control portion, a modulator, an amplifier, and control voltage signal selecting means.

That is, the I/Q signal amplitude control portion variably controls the shape of a rise and a fall of the waveform of a baseband signal and its burst transmission time from the end of the rise to the beginning of the fall. The modulator modulates the baseband signal controlled in the I/Q signal amplitude control portion into a high-frequency signal for transmission. The amplifier amplifies the transmission high-frequency signal modulated in the modulator. The control voltage signal selecting means outputs a predetermined constant voltage which is determined by a transmission power level signal, so as to control an output power of the amplifier.

In a burst transmitter using a constant envelope modulation, the shape of a rise and a fall of the waveform of the baseband signal and its burst transmission time from the end of the rise to the beginning of the fall are variably controlled. This eliminates the need for ramp process to the control voltage to the power amplifier and reduces the amount of memory, the amount of processing or the consumption of power, and provides a burst transmitter using a constant envelope modulation in which the spreading of spectrum resulting from the magnitude of the transmission output power can be suppressed during the transmission.

According to a second aspect of the present invention, in a dual-mode burst transmitter using a constant envelope modulation system and an amplitude modulation system, a transmission output power control device includes an I/Q signal amplitude control portion, a modulator, an amplifier, and control voltage signal selecting means.

That is, the I/Q signal amplitude control portion variably controls the shape of a rise and a fall of the waveform of a baseband signal and its burst transmission time from the end of the rise to the beginning of the fall. The modulator modulates the baseband signal controlled in the I/Q signal amplitude control portion into a transmission high-frequency signal in accordance with the modulation system signal. The amplifier amplifies the transmission high-frequency signal modulated in the modulator. The control voltage signal selecting means outputs a predetermined constant voltage which is determined by the modulation system signal and a transmission power level signal, so as to control an output power of the amplifier.

In a dual-mode burst transmitter using an amplitude modulation and a constant envelope modulation, the envelope of the transmission output power is controlled by controlling the baseband signal no matter which of the modulation systems is used. Furthermore, the burst transmission time is variable. This eliminates the need for provision of separate control devices for ramping the transmission output power in the individual modulation systems and reduces the amount of memory, the amount of processing or the consumption of power. Also, the spreading of spectrum due to the length of the burst transmission time can be suppressed during the transmission.

According to a third aspect of the present invention, in a dual-mode burst transmitter using a constant envelope modulation system and an amplitude modulation system, a transmission output power control device includes an I/Q signal amplitude control portion, a modulator, an amplifier, a detector, and a signal processing portion.

That is, the I/Q signal amplitude control portion variably controls the shape of a rise and a fall of the waveform of a baseband signal and its burst transmission time from the end of the rise to the beginning of the fall. The modulator modulates the baseband signal controlled in the I/Q signal amplitude control portion into a high-frequency signal for transmission in accordance with the modulation system signal. The amplifier amplifies the transmission high-frequency signal modulated in the modulator. The detector detects a transmission output power outputted from the amplifier. The signal processing portion outputs a control voltage to the amplifier in accordance with a signal from the detector in such a way as to make the transmission output power attain a target output power, obtains a difference between a target control voltage and the control voltage with which the transmission output power of the amplifier attained the target output power, and controls the I/Q signal amplitude control portion so that the shape of the rise and the fall of the waveform of the baseband signal and its burst transmission time from the end of the rise to the beginning of the fall are varied on the basis of the difference.

The transmission output power of the amplifier is detected and fed back. Thus the nonlinearity of the amplifier can be estimated and the ramp process to the baseband signal can be performed on the basis of the estimated nonlinearity. The spreading of spectrum due to the nonlinearity of the amplifier can thus be suppressed during the transmission.

According to a fourth aspect of the present invention, in a transmission output power control method for use in a burst transmitter using a constant envelope modulation system, the envelope of an output power for transmission is controlled by variably controlling the shape of a rise and a fall of the waveform of a baseband signal and its burst transmission time from the end of the rise to the beginning of the fall.

In a burst transmitter using a constant envelope modulation system, the envelope of the transmission output power is controlled by variably controlling the shape of a rise and a fall of the waveform of the baseband signal and its burst transmission time from the end of the rise to the beginning of the fall. This reduces the amount of memory, the amount of processing or the consumption of power required to ramp the transmission output power of the burst transmitter, and the spreading of spectrum can be suppressed during the transmission.

According to a fifth aspect of the present invention, in a transmission output power control method for use in a dual-mode burst transmitter using a constant envelope modulation system and an amplitude modulation system, whichever of the modulation systems is used, the envelope of an output power for transmission is controlled by variably controlling the shape of a rise and a fall of the waveform of a baseband signal and its burst transmission time from the end of the rise to the beginning of the fall.

In a dual-mode burst transmitter using a constant envelope modulation system and an amplitude modulation system, whichever of the modulation systems is used, the envelope of the transmission output power is controlled by variably controlling the shape of a rise and a fall of the waveform of the baseband signal and its burst transmission time from the end of the rise to the beginning of the fall. This reduces the amount of memory, the amount of processing or the consumption of power required to ramp the transmission output power of the burst transmitter, and the spreading of spectrum can be reduced during the transmission.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing the relation between the transmission power level signal and the ramp amplitude waveforms stored in the ramp amplitude waveform data memory in the second preferred embodiment;

FIG. 12 is a diagram showing the relation between the ramp amplitude waveforms stored in the fourth preferred embodiment, the transmission power level signal, and the amplifier temperature;

FIG. 14 is a diagram showing the relation between the ramp amplitude waveforms stored in the fifth preferred embodiment, the transmission power level signal, and the power-supply voltage;

FIG. 19 is a diagram showing the relation between the ramp amplitude waveforms stored in the seventh preferred embodiment and the amplifier nonlinearity;

DESCRIPTION OF THE PREFERRED EMBODIMENTS

The preferred embodiments of the present invention are now described referring to the accompanying drawings.

First Preferred Embodiment

Figure 1:
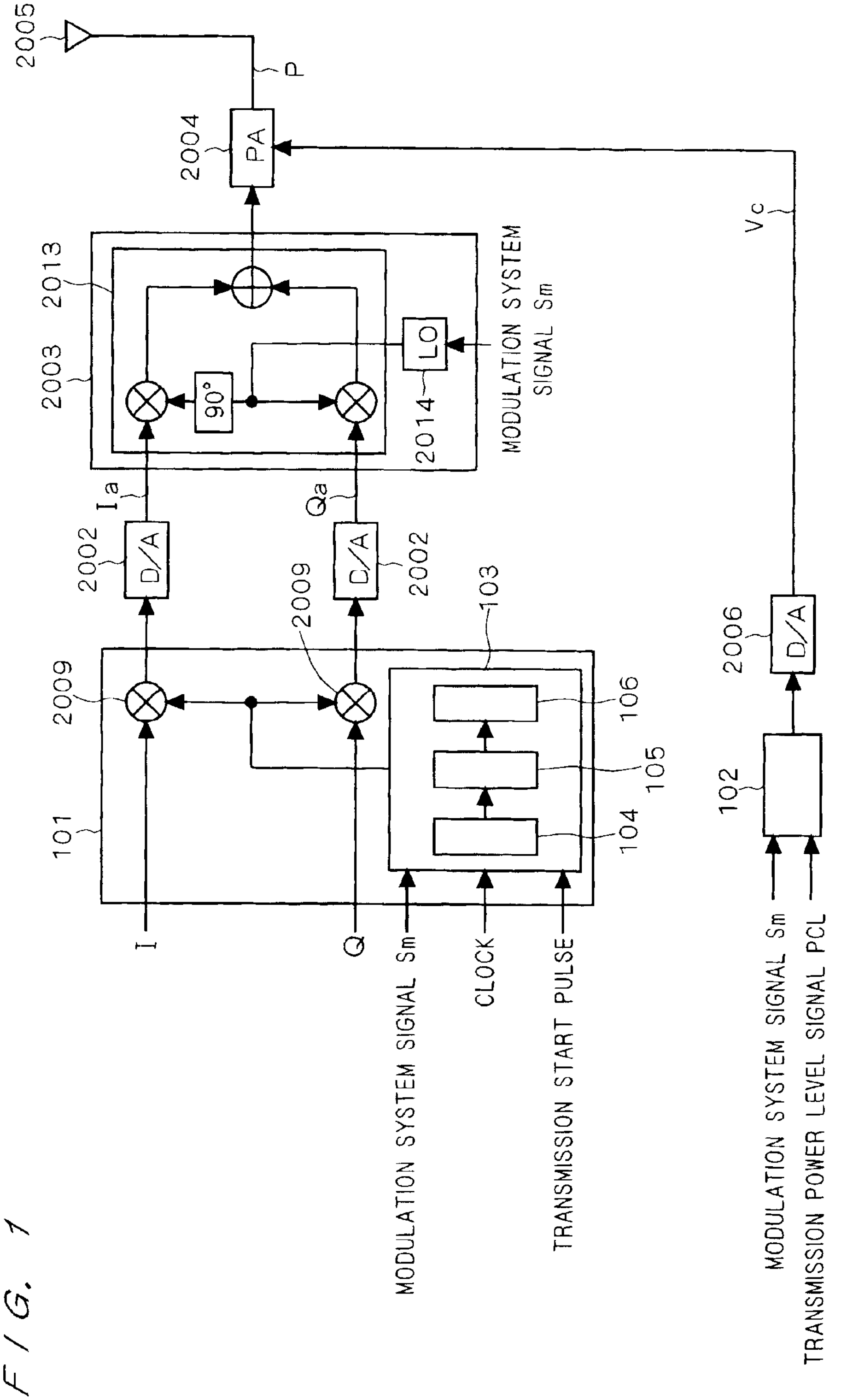
FIG. 1 is a functional block diagram showing a burst transmitter according to a first preferred embodiment of the present invention.

FIG. 1 is a block diagram that shows a dual-mode burst transmitter according to a first preferred embodiment; the dual-mode burst transmitter uses an amplitude modulation system and a constant envelope modulation system (e.g. the PDC system and the GSM system). In FIG. 1, the baseband signal D/A converters 2002, the modulating unit 2003, the power amplifier 2004, the antenna 2005, the control voltage signal D/A converter 2006, and the multiplication mixers 2009 are the same as those described in Background Art. The reference numeral 101 shows an I/Q signal amplitude control unit which includes a waveform data generating portion 103 and the multiplication mixers 2009, where the waveform data generating portion 103 includes a counter 104, a table reference number generating portion 105, and a ramp amplitude waveform data memory 106. The waveform data generating portion 103 receives as its inputs a modulation system signal Sm, a clock signal, and a transmission start pulse.

Unlike the conventional I/Q signal amplitude control unit 2001, the I/Q signal amplitude control unit 101 has a function of varying the rising and falling waveform of the baseband signals and their effective data transmission section Tb from the end of the rise to the beginning of the fall according to the modulation system, so that the ramping process can be performed in the I/Q signal amplitude control unit irrespective of which modulation system is selected. The effective data transmission section Tb will be fully described later. The reference numeral 102 shows a control voltage signal selecting unit which, during transmission, outputs digital data for the control voltage Vc to the power amplifier 2004 in accordance with the input modulation system signal Sm and the transmission power level signal PCL; the control voltage signal selecting unit 102 contains a nonvolatile memory etc. The control voltage signal selecting unit 102 can be realized by reading digital control voltage data stored in a nonvolatile memory. In this case it is not necessary to ramp the control voltage signal Vc, so that the space for storing the collection of digital voltage data required for the ramping process can be reduced as compared with that in the conventional example. The control voltage signal selecting unit 102 can also be realized by using a processor.

Next, its operation is described. In the I/Q signal amplitude control unit 101, the digital baseband signals I and Q are ramped on the basis of the modulation system signal Sm transmitted from the base station of the radio network (for example, Sm=0for the amplitude modulation and Sm=1 for the constant envelope modulation), so that the digital baseband signals I and Q exhibit a ramped waveform having a slowly rising ramp up and a slowly falling ramp down. The ramped digital baseband signals I and Q are converted to analog signals in the baseband signal D/A converters 2002. In the modulating unit 2003, the quadrature modulator 2013 quadrature-modulates the converted analog baseband signals Ia and Qa with a high-frequency signal outputted from the local oscillator 2014 to generate a high-frequency signal to be transmitted. The high-frequency signal outputted from the local oscillator 2014 has a frequency that is used in the modulation system selected by the base station. The high-frequency signal to be transmitted is amplified in the power amplifier 2004 and transmitted as a transmission output P from the antenna 2005. In this process, the control voltage signal selecting unit 102 receives as its inputs the modulation system signal Sm and the transmission power level signal PCL, and the control voltage signal selecting unit 102 sends digital control voltage data corresponding to the transmission power level signal PCL to the control voltage signal D/A converter 2006. The control voltage signal D/A converter 2006 converts the digital control voltage data to an analog signal and outputs it, and the output analog signal controls the power amplifier 2004 as the control voltage signal Vc.

Figure 2:
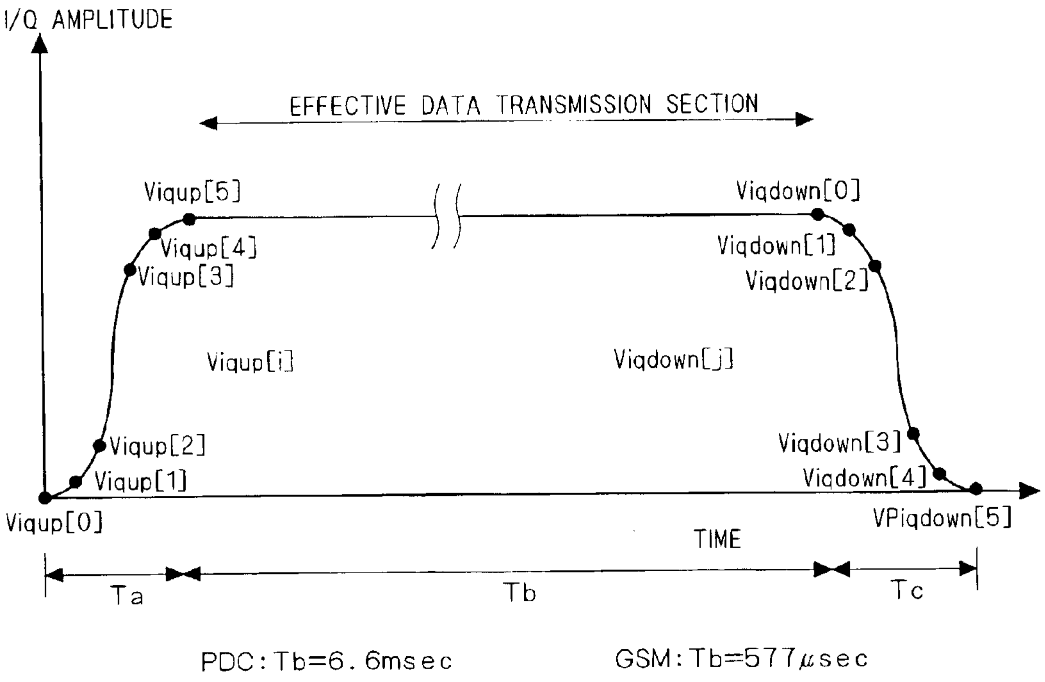
FIG. 2 is a diagram showing an amplitude waveform of a ramped analog baseband signal.

FIG. 2 is a diagram that shows the amplitude waveform of the analog baseband signal which has been ramped in the I/Q signal amplitude control unit 101 and converted to an analog signal. While the analog baseband signals Ia and Qa which are not ramped show a rectangular waveform having a vertical rise and a vertical fall, the ramped analog baseband signals Ia and Qa are corrected to exhibit a waveform which gently and slowly rises and falls. Now, the time required for rise is referred to as a ramp up time Ta, the time from the end of the rise to the beginning of the fall is referred to as an effective data transmission time Tb, and the time required for fall is referred to as a ramp down time Tc. The effective data transmission section Tb has a sufficient height and a constant voltage and hence is capable of effectively sending data; the effective data transmission section Tb corresponds to the burst transmission time of the burst transmitter of this invention. The burst transmission time must approximately be equal to the value of the burst transmission time determined by the modulation system. For example, the burst transmission time is determined to be about 6.6 msec (at full rate) in the PDC system, an amplitude modulation system, and to be about 577 μsec (at full rate) in the GSM system, a constant envelope modulation system.

Accordingly the effective data transmission section Tb must be varied depending on the modulation system. The effective data transmission section Tb corresponds to the time in which the I/Q amplitude value Viq[n] of the analog baseband signals Ia and Qa is achieving a prescribed voltage. The time in which the prescribed voltage is being achieved should not last unnecessarily long, since the spectrum will spread if this time lasts too long. Accordingly, in the invention, the I/Q signal amplitude control unit 101 has a function for causing the effective data transmission section Tb to vary depending on the modulation system.

Figure 3:
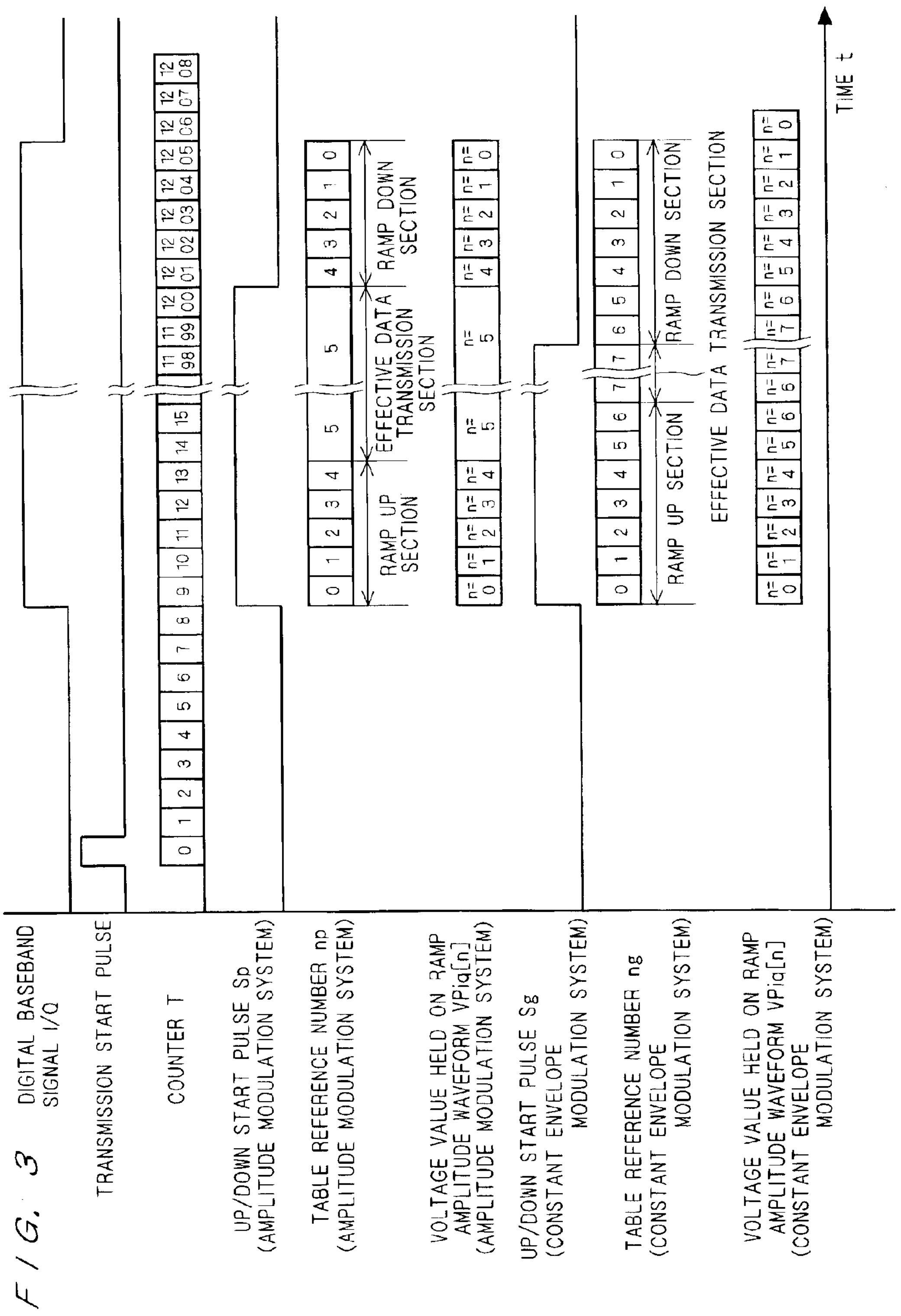
FIG. 3 is a diagram showing operation of the waveform data generating portion of the first preferred embodiment.

FIG. 3 is a diagram that illustrates signal timing in the ramp process to the digital baseband signals I and Q; for comparison between the process in the amplitude modulation and that in the constant envelope modulation, the diagram shows up and down start waveforms Sp and Sg, table reference numbers, np and ng, and I/Q amplitude values VPiq[n] and VGiq[n] that are used in the amplitude modulation system and the constant envelope modulation system.

First, the I/Q signal amplitude control unit 101 operates as shown below when the modulation system signal Sm provided to the waveform data generating portion 103 indicates the amplitude modulation (Sm=0). When the transmission start pulse is inputted to the waveform data generating portion 103, the counter 104 starts counting up its value T in response to the transmission start pulse. When a preset time at which the digital baseband signals I and Q start rising is reached (T=9 in the example shown in the diagram), then the up and down start pulse Sp rises. At the rise of the up and down start pulse Sp, the table reference number generating portion 105 specifies a table for use in the amplitude modulation and specifies table reference numbers, np, for reading the I/Q amplitude values VPiq[n] on the table.

A method for determining the I/Q amplitude values VPiq[n] held in the table will be described later. An appropriate number of table reference numbers np, i.e., a number appropriate for use in the amplitude modulation system (five in this example), are specified, and the table reference number np is then fixed until the up and down start pulse Sp falls. When the up and down start pulse Sp falls, then an appropriate number of table reference numbers np are specified again. In this preferred embodiment, in order to reduce the number of I/Q amplitude values VPiq[n] to be stored, the I/Q amplitude values VPiq[n] used for ramp up are also used for ramp down. When the table reference number np varies from 0 to 5 as shown in this diagram, the I/Q amplitude values VPiq[0] to VPiq[5] are read from the ramp amplitude waveform data memory 106. Also, when the table reference number np varies from 5 to 0 as shown in this diagram, the I/Q amplitude values VPiq[5] to VPiq[0] are read from the ramp amplitude waveform data memory 106. The multiplication mixers 2009 multiply the I/Q amplitude values VPiq[n] outputted from the waveform data generating portion 103 and the digital baseband signals I and Q to produce the ramped digital baseband signals I and Q.

Next, referring to FIG. 3, the I/Q signal amplitude control unit 101 operates as described below when the modulation system signal Sm provided to the waveform data generating portion 103 indicates the constant envelope modulation system (Sm=1). When the transmission start pulse is inputted to the waveform data generating portion 103, then the counter 104 configured on the basis of the clock starts counting. The counter 104 counts up and attains a preset time at which the digital baseband signals I and Q rise (T=9 in the example shown in the diagram), and then the up and down start pulse Sg rises. At the rise of the up and down start pulse Sg, the table reference number generating portion 105 specifies a table for use in the constant envelop modulation and specifies table reference numbers ng for reading the I/Q amplitude values VGiq[n] on the table.

An appropriate number of table reference numbers ng, i.e., a number appropriate for use in the constant envelope modulation (seven in this example), are specified, and the table reference number ng is then fixed until the up and down start pulse Sp falls. When the up and down start pulse Sg falls, then an appropriate number to table reference numbers ng are specified again. In this preferred embodiment, the same I/Q amplitude values VGiq[n] are used for ramp up and ramp down. When the table reference number ng varies from 0 to 7 as shown in this diagram, the I/Q amplitude values VGiq[0] to VGiq[7] are read from the ramp amplitude waveform data memory 106. Also, when the table reference number ng varies from 7 to 0 as shown in this diagram, the I/Q amplitude values VGiq[7] to VGiq[0] are read from the ramp amplitude waveform data memory 106.

The I/Q amplitude value Viq[n] corresponds to the table reference number n; six I/Q amplitude values VPiq[n] are set for the rising ramp and eight I/Q amplitude values VGiq[n] are set for the rising ramp. A larger number of values (a larger number of values Viq[n]) are thus set in the constant envelope modulation than in the amplitude modulation. Also, the up and down start pulse Sg for the constant envelope modulation is shorter than the up and down start pulse Sp for the amplitude modulation. This lengthens the ramp up section Ta and the ramp down section Tc and shortens the effective data transmission section Tb. In this way, the effective data transmission section Tb can be varied by varying the number of n.

Figure 4:
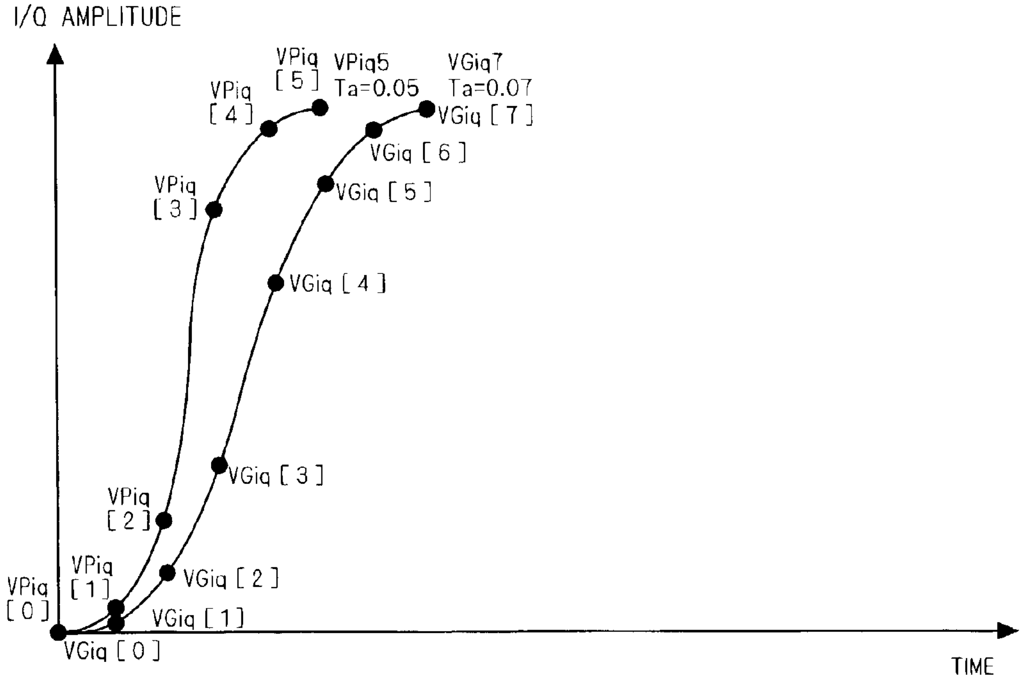
FIG. 4 is a diagram showing as analog waveforms the ramp amplitude waveforms selected in the I/Q signal amplitude control unit of the first preferred embodiment.

FIG. 4 shows, in the form of analog signals, the ramp amplitude waveforms Viq stored in correspondence with the respective modulation systems in the ramp amplitude waveform data memory 106. When the ramp process is conducted as shown in FIG. 3, the ramp up portions exhibit amplitude waveforms as shown in this diagram. In this diagram, the ramp amplitude waveform used for the amplitude modulation is represented by VPiq5 including the I/Q amplitude values VPiq[0] to VPiq[5], and the ramp amplitude waveform used for the constant envelope modulation is represented by VGiq7 including the I/Q amplitude values VGiq[0] to VGiq[7].

Next, a method for determining the I/Q amplitude values Viq[n] stored in this preferred embodiment is described with arithmetic expressions:

$$Viq\mathrm{up}[i]=Viq\times[1-\mathrm{COS}\{(\pi/T)\times(\Delta t\times i)\}]$$

$$Viq\mathrm{down}[j]=Viq\mathrm{up}[i\mathrm{max}-\mathrm{j}]$$

| | |
|---|---|
| Viqup[i] | the ith I/Q amplitude value Viq[n] for ramp up |
| Viqdown[j] | the jth I/Q amplitude value Viq[n] for ramp down Where, in the expressions, "Viq" is regarded as VPiq in the case of amplitude modulation and as VGiq in the case of constant envelope modulation. |
| i, j | = 0 to 5 (in amplitude modulation) = 0 to 7 (in constant envelope modulation) |
| Viq | I/Q maximum amplitude value |

-continued

| | |
|---|---|
| imax | maximum value of i<br>= 5 (in amplitude modulation)<br>= 7 (in constant envelope modulation) |
| COS | cosine |
| π | pi |
| T | ramp up or ramp down time |
| Δ t | ramp voltage generation cycle time<br>When the baseband circuit is formed of a logic circuit, this is a discontinuous time having a certain fixed time width (Δ t). |

Values obtained according to the expressions above are provided with the table reference numbers, n, and stored in the ramp amplitude waveform data memory 106; the table reference numbers n can thus be selected to enable the operation of the I/Q signal amplitude control unit 101.

Figure 5A:
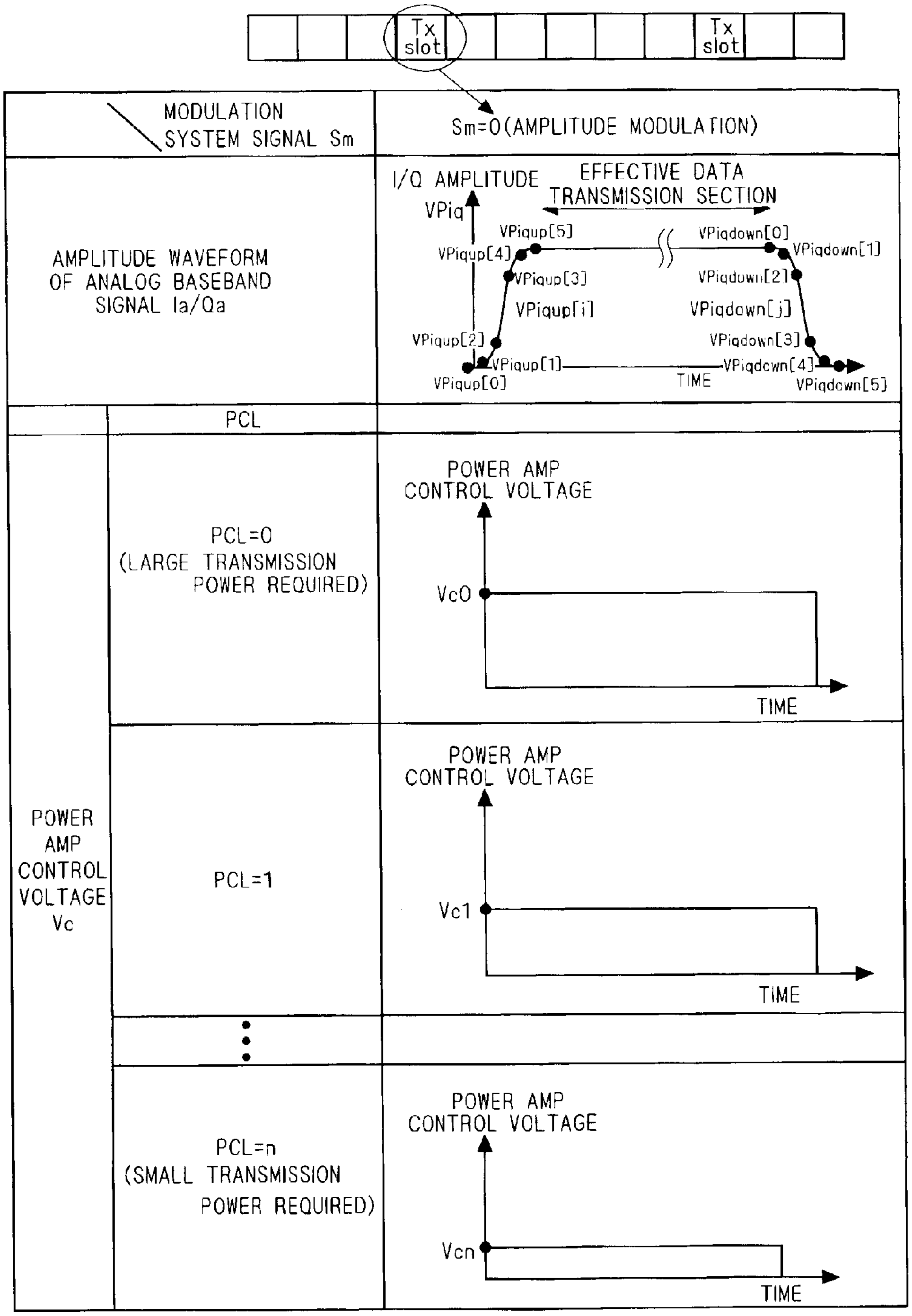
FIGS. 5A and 5B are diagrams showing an amplitude waveform of the analog baseband signal and the control voltage to the power amplifier which are used in the invention.
Figure 5B:
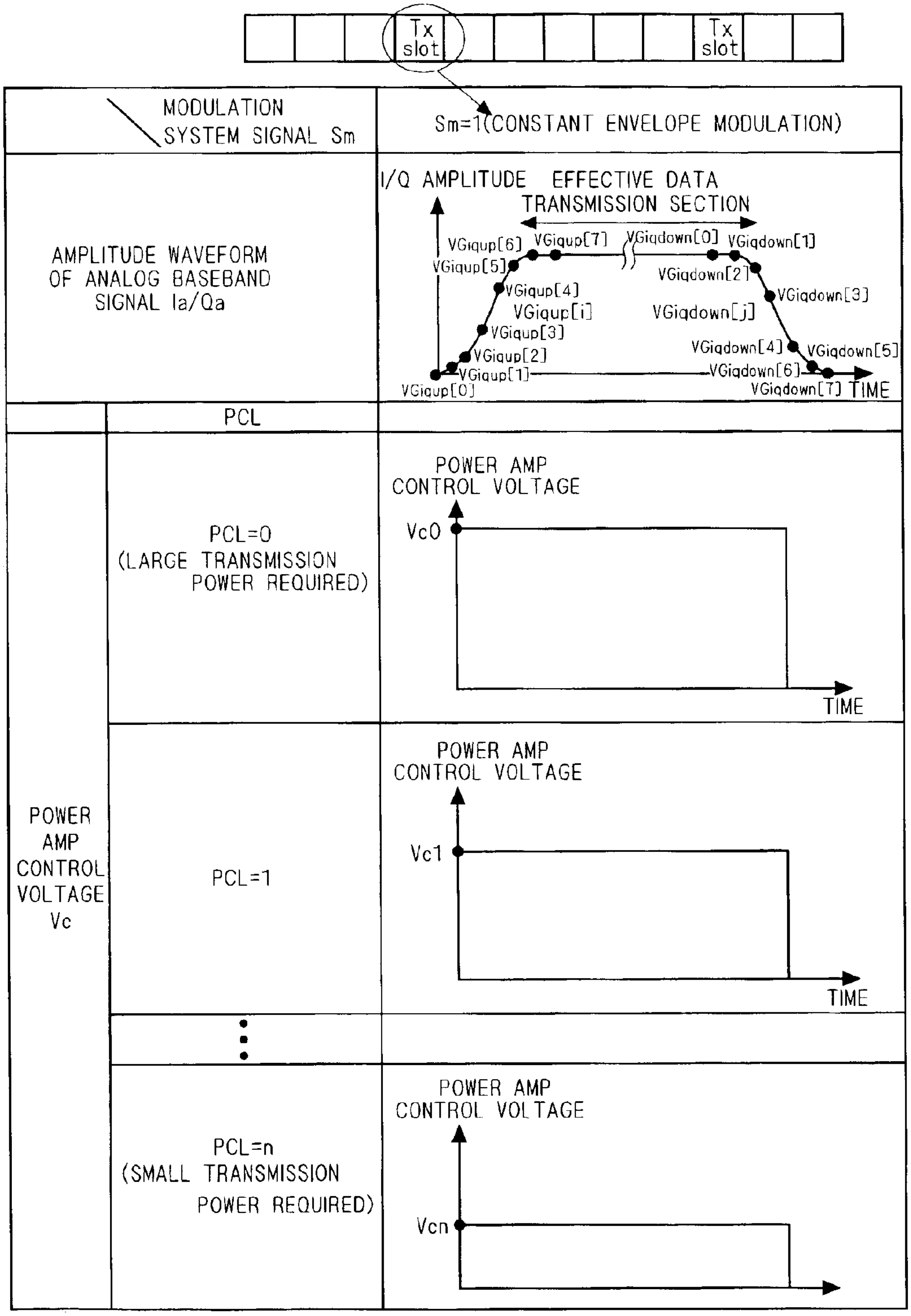

FIGS. 5A and 5B show, in the upper section, the amplitude waveforms of the analog baseband signals Ia and Qa that are ramped as shown above in the I/Q amplitude control unit 101 according to the amplitude modulation and constant envelope modulation systems, respectively.

Next, the control voltage Vc is described referring to the lower sections in FIGS. 5A and 5B; the control voltage Vc is controlled in the control voltage signal selecting unit 102 on the basis of the modulation system signal and the transmission power level signal PCL In either of the amplitude modulation system and the constant envelope modulation system, a small power suffices for the transmission output P when the transmission power level signal PCL indicates a high level (PCL=n); the control voltage signal selecting unit 102 thus selects a small constant voltage as the control voltage Vc. When the transmission power level signal PCL indicates a small level (PCL=0), then a large power is needed for the transmission output P, so that the control voltage Vc0 involves a large constant voltage. The control voltage signal D/A converter 2006 converts the input digital control voltage data into the control voltage Vc in the form of an analog signal and continuously outputs the constant voltage during the transmission. Note that, as compared with the control voltage Vc to the power amplifier 2004 required in the amplitude modulation system, the control voltage Vc used in the constant envelope modulation system is higher for a reason related to the system. While it is assumed herein that a larger control voltage Vc0 provides the transmission output P with a larger power, it depends on the characteristics of the transmission power amplifier 2004. A smaller control voltage Vc0 may provide the transmission output P with a larger power.

In FIGS. 5A and 5B, in either of the amplitude modulation system and constant envelope modulation system, the control voltage Vc to the power amplifier 2004 exhibits a predetermined constant voltage value. The present invention thus allows the control voltage signal selecting unit 102 to be constructed in a simplified manner.

According to the first preferred embodiment, as shown above, the digital baseband signals I and Q are ramp-processed whichever of the modulation systems is used (amplitude modulation or constant envelope modulation) to ramp-process the transmission output. Thus it is not necessary to apply ramp process to the control voltage Vc to the power amplifier 2004. This eliminates the need for the memory for storing ramp amplitude waveforms for the control voltage Vc in correspondence with the power levels indicated by the transmission power level signal PCL, and also eliminates the need for the process performed prior to each transmission, and the amount of processing and the consumption of power can be reduced.

Second Preferred Embodiment

Figure 6:
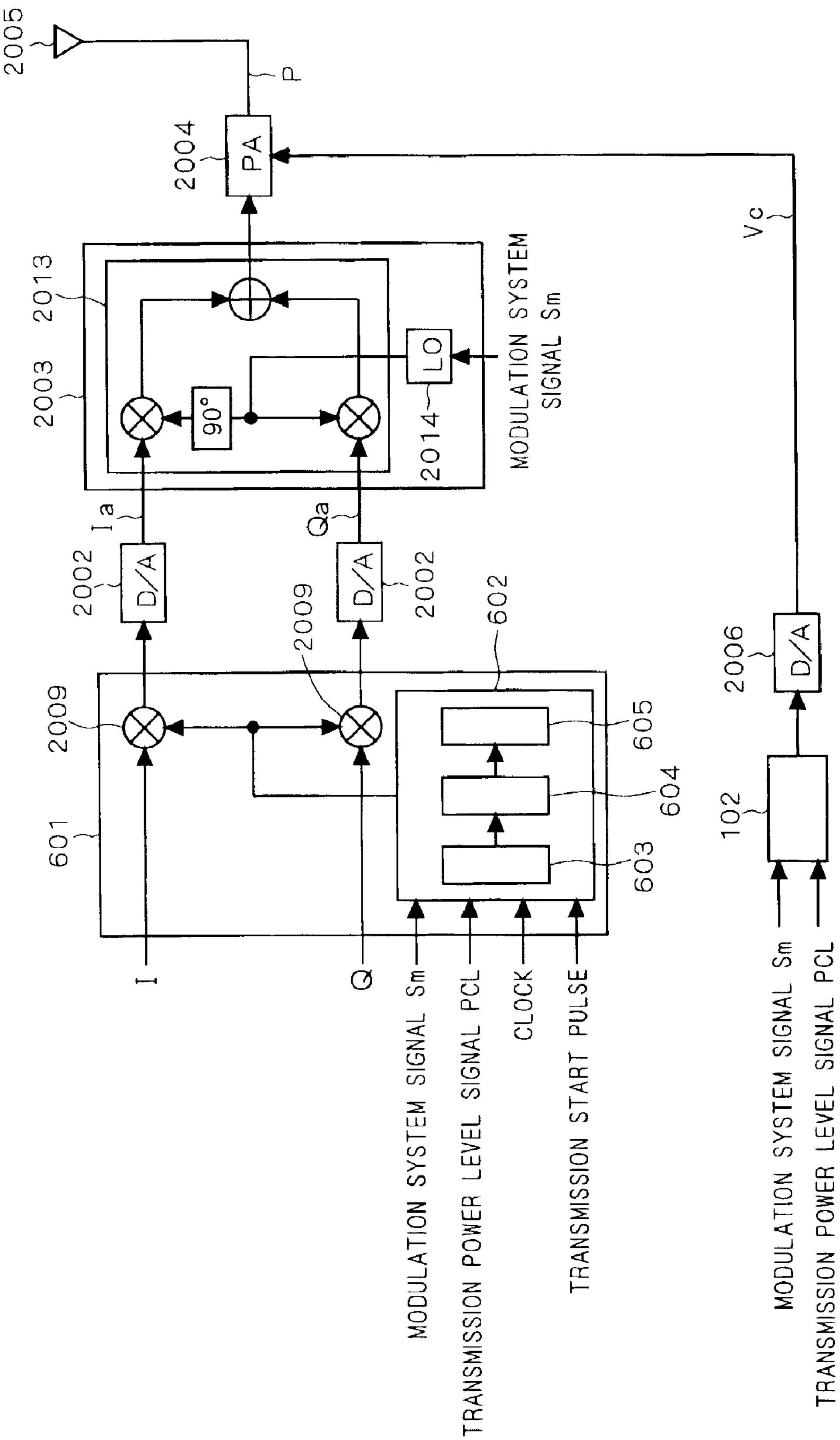
FIG. 6 is a functional block diagram showing a burst transmitter according to a second preferred embodiment of the invention.

FIG. 6 is a block diagram showing a dual-mode burst transmitter which uses an amplitude modulation system and a constant envelope modulation system (e.g. PDC and GSM) according to a second preferred embodiment. In FIG. 6, the reference numeral 601 denotes an I/Q signal amplitude control unit including a waveform data generating portion 602 and the multiplication mixers 2009, where the waveform data generating portion 602 includes a counter 603, a table reference number generating portion 604, and a ramp amplitude waveform data memory 605. This structure differs from that of the first preferred embodiment in that the transmission power level signal PCL is given to the waveform data generating portion 602 so that the nonlinearity produced between the digital baseband signals I and Q and the transmission output P can be considered to suppress the spreading of the spectrum. In the ramp amplitude waveform data memory 605, as shown in FIG. 8, the rise time Ta and the fall time Tc of the baseband signals are set in correspondence with the levels of the transmission power level signal PCL. Accordingly, as compared with the table reference number generating portion 105, the table reference number generating portion 604 performs its processing on the basis of a more variety of conditions. In other respects the configuration is the same as that of the first preferred embodiment and therefore not described again.

Operation of the second preferred embodiment is now described. When the amplitude modulation system is used in the second preferred embodiment, as in the first preferred embodiment, the digital baseband signals I and Q are ramped in the I/Q signal amplitude control unit 601 and the ramped digital baseband signals I and Q are converted to analog baseband signals Ia and Qa in the baseband signal D/A converters 2002. Next, in the modulating unit 2003, the quadrature modulator 2013 quadrature-modulates the analog baseband signals Ia and Qa with the high-frequency signal outputted from the local oscillator 2014 to produce a high-frequency signal for transmission. The high-frequency signal outputted from the local oscillator 2014 has a frequency that is used in the amplitude modulation system selected by the base station. The high-frequency signal for transmission is amplified in the power amplifier 2004 and transmitted from the antenna 2005 as the transmission output P. In this process, the modulation system signal Sm (Sm=0) and the transmission power level signal PCL are provided to the control voltage signal selecting unit 102, and digital control voltage data corresponding to the modulation system signal Sm and the transmission power level signal PCL is sent to the control voltage signal D/A converter 2006. The control voltage signal D/A converter 2006 converts the digital control voltage data to an analog signal and outputs it, and this analog signal controls the power amplifier 2004 as the control voltage Vc.

Figure 7:
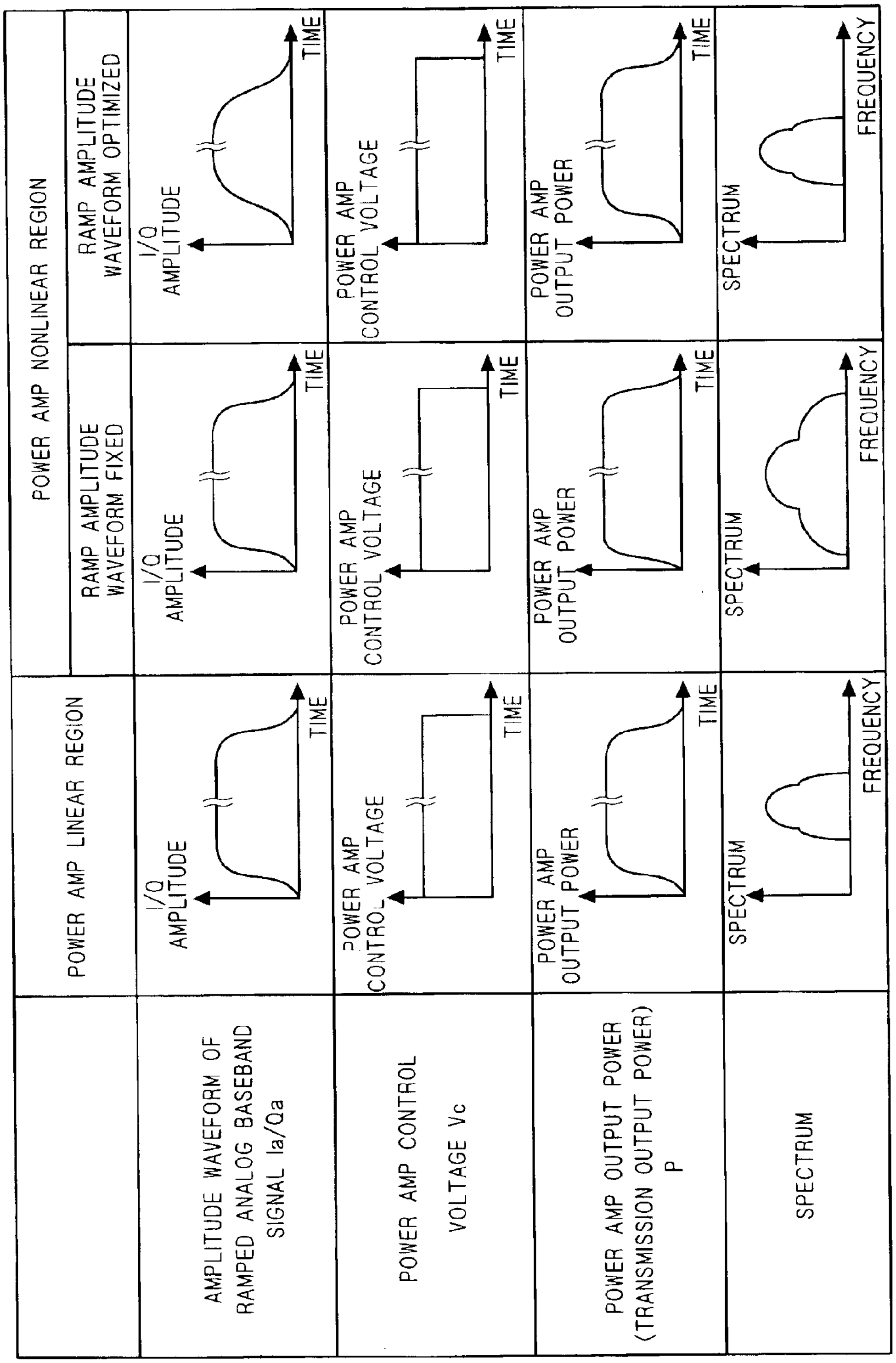
FIG. 7 is a diagram showing the relation between the amplitude waveform of the analog baseband signal, the output power (transmission output power) waveform from the power amplifier, and its spectrum in the linear region and nonlinear region of the power amplifier.

Next, when the constant envelope modulation system is used, the structure operates as shown below. FIG. 7 shows the linearity of the analog baseband signals Ia and Qa and the transmission output P and the spreading of the spectrum which are exhibited when the ramp process to the transmission output P is achieved by ramping the digital baseband signals I and Q. As shown in the left-hand section in FIG. 7, the spectrum does not spread when the power amplifier 2004 is operating in the linear region. However, as shown in the middle section in FIG. 7, when the power amplifier 2004 operates in the nonlinear region (e.g. when the transmission output power is high), the ramp up and the ramp down of the transmission output P do not smoothly vary if the I/Q signal amplitude control unit 601 provides a fixed pattern of waveform, which causes the spectrum to spread in a wider range. This preferred embodiment aims to solve this problem which takes place when the envelope of the transmission output P is ramped by ramping the digital baseband signals I and Q.

Figure 9:
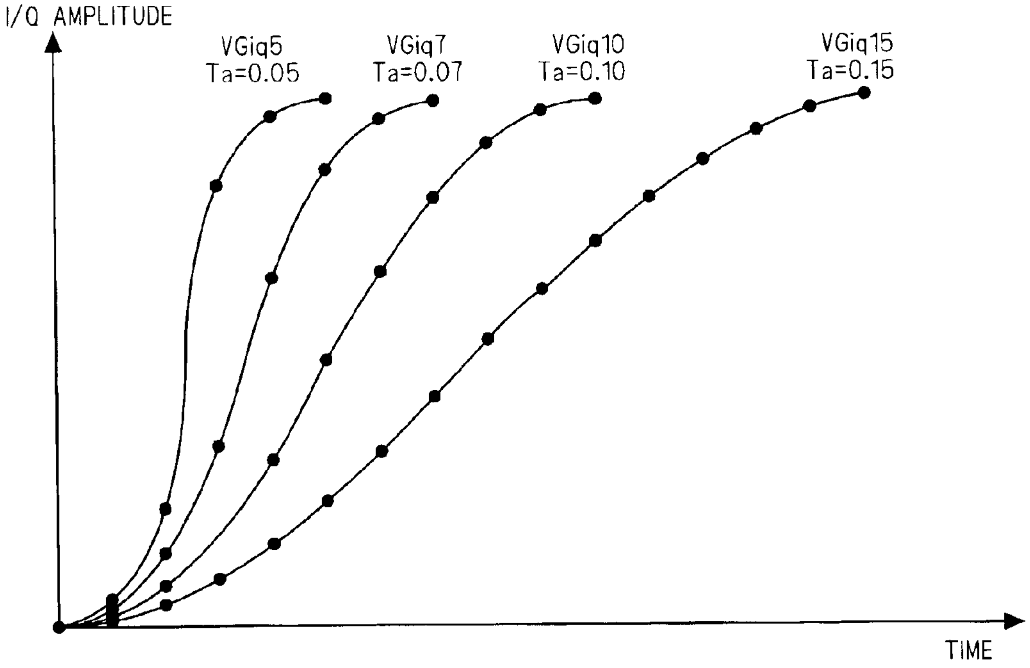
FIG. 9 is a diagram showing as analog waveforms the ramp amplitude waveforms used in the second preferred embodiment.

In this case, the spreading of the spectrum is due to the fact that the burst transmission section Tb of the waveform of the transmission output P is lengthened. Accordingly, as the countermeasure, the waveform data generating portion 602 in the I/Q signal amplitude control unit 601 produces a plurality of ramp amplitude waveforms VGiq for use in the constant envelope modulation in accordance with the level indicated by the transmission power level signal PCL. That is to say, as shown in FIG. 8, when the transmission power is high (when PCL=0), the ramp amplitude waveform VGiq15, in which the analog baseband signals Ia and Qa are provided with a longer ramp up time Ta and a longer ramp down time Tc, is selected to shorten the burst transmission time Tb. On the other hand, when the transmission power is low (when PCL=3), then the ramp amplitude waveform VGiq5 having a shorter ramp up time Ta and a shorter ramp down time Tc is selected to lengthen the burst transmission time Tb. FIG. 8 shows the ramp amplitude waveforms VGiq to be stored in the ramp amplitude waveform data memory 605 in this preferred embodiment and the values of Ta, Tb and Tc at the individual levels of the transmission power level signal PCL, where the transmission slot time is assumed to be 1.00. FIG. 9 shows the ramp amplitude waveforms VGiq shown in FIG. 8 as analog waveforms.

Referring to FIGS. 8 and 9, four combinations of times are prepared in correspondence with the levels indicated by the transmission power level signal PCL, which range from the ramp amplitude waveform VGiq5 having the shortest ramp up section Ta to the ramp amplitude waveform VGiq15 having the longest ramp up section Ta. Among the ramp amplitude waveforms VGiq which exhibit the waveforms shown in FIG. 9 when converted into analog form, an optimum ramp amplitude waveform VGiq is selected on the basis of the modulation system signal Sm and the transmission power level signal PCL, and this ramp amplitude waveform VGiq and the digital baseband signals I and Q are multiplied together. In this process, the I/Q amplitude values Vgiq[n] used in the ramp up process are also used in the ramp down process in the reverse order, i.e. the I/Q amplitude value VGiqup[i] that is used as the ith value in ramp up is used as the backwardly counted ith value in ramp down, so that only the I/Q amplitude values [n] used for the ramp up are stored in the ramp amplitude waveform data memory 605.

The number of points VGiq[n] on the waveforms shown in FIG. 9 differs depending on the level indicated by the transmission power level signal PCL. Using a larger number of values VGiq[n] increases the ramp up time Ta and makes the rise slower. When the control voltage Vc is higher, the nonlinearity in the relation between the digital baseband signals I, Q and the transmission output P is stronger. Hence, the nonlinearity in the burst transmitter becomes stronger when the transmission power level signal PCL indicates a lower level (PCL=0). As the nonlinearity becomes stronger, a ramp amplitude waveform VGiq having a smoother waveform is selected for the ramp up accordingly. In this way, when the transmission power level signal PCL indicates a low level (PCL=0), the power of the transmission output P from the power amplifier is high, so that the ramp amplitude waveform VGiq15 having a long ramp up section is selected from the stored ramp amplitude waveforms VGiq, and when the transmission power level signal PCL indicates a high level (PCL=3), the power of the transmission output P from the power amplifier is low, so that the ramp amplitude waveform VGiq5 for use with less nonlinearity is selected.

As shown above, according to the method of the second preferred embodiment, when the constant envelope modulation is used, the I/Q amplitude can be controlled most favorably in accordance with the level indicated by the transmission power level signal PCL. Thus, as shown in the right-hand section in FIG. 7, the spreading of the spectrum can be easily prevented even when the power amplifier 2004 operates in a nonlinear region.

Third Preferred Embodiment

Figure 10:
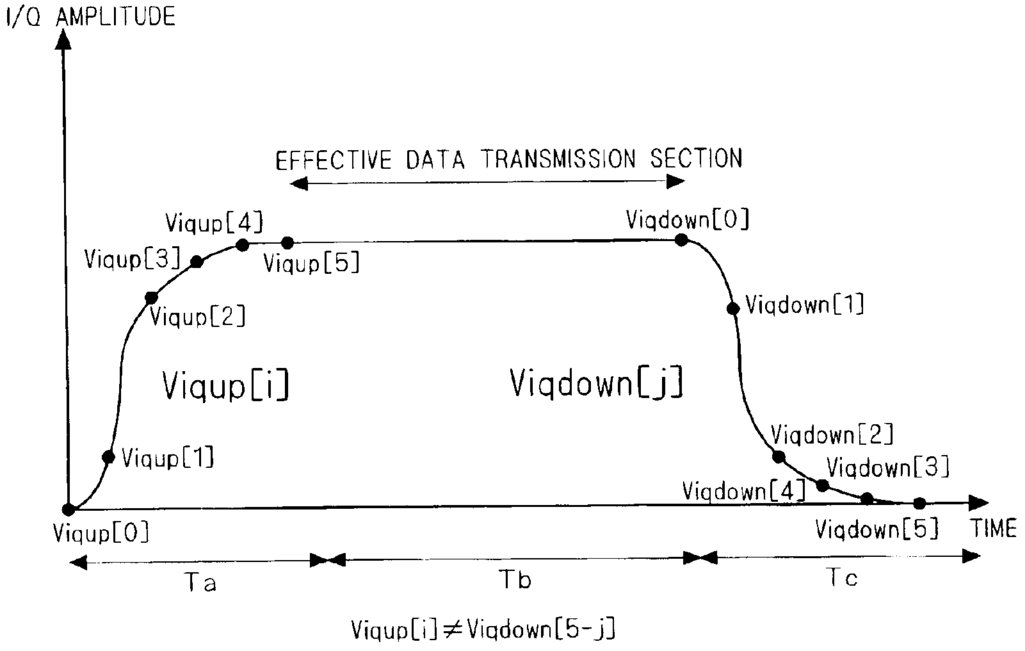
FIG. 10 is a diagram showing an amplitude waveform of the analog baseband signal obtained in the I/Q signal amplitude control unit used in a third preferred embodiment of the invention.

While the structure of a third preferred embodiment is the same as that of the second preferred embodiment, the third preferred embodiment differs from the second preferred embodiment in that the ramp amplitude waveform data memory 605 separately stores the I/Q amplitude values Viq[n] for use in the ramp up process and those for use in the ramp down process. FIG. 10 shows a waveform of the analog baseband signals Ia and Qa that is obtained in the I/Q signal amplitude control unit used in this invention, where the horizontal axis shows the time and the vertical axis shows the I/Q amplitude. As shown in FIG. 10, the waveform of the transmission output is not symmetrical on the time base but is ramped up so that the waveform swells up and ramped down so that the waveform caves in. It is thought that controlling the amplitude waveform in this way suppresses the spreading of the spectrum. Thus the third preferred embodiment enables the ramp process to more effectively suppress the spectrum spreading than the second preferred embodiment.

Operation in the third preferred embodiment is now described. When the amplitude modulation system is used in the third preferred embodiment, as in the second preferred embodiment, the digital baseband signals I and Q are ramped in the I/Q signal amplitude control unit 601 and converted to analog signals in the baseband signal D/A converters 2002. Note that the I/Q amplitude values VPiq[n] used for ramp up and those used for ramp down are separately stored in the ramp amplitude waveform data memory 605. In other respects the operation is the same as that of the second preferred embodiment and therefore not described again.

Next, operation performed when the constant envelope modulation system is used will be described. The digital baseband signals I and Q are ramped in the I/Q signal amplitude control unit 601 and converted to analog signals in the baseband signal D/A converters 2002. Note that the I/Q amplitude values VGiq[n] used for ramp up and those used for ramp down are separately, and in correspondence with the levels of the transmission power level signal PCL, stored in the ramp amplitude waveform data memory 605. In other respects the operation is the same as that of the second preferred embodiment and therefore not described again.

As shown above, according to the third preferred embodiment, the spreading of the spectrum can be more effectively suppressed even when the power amplifier 2004 operates in the nonlinear region.

Fourth Preferred Embodiment

Figure 11:
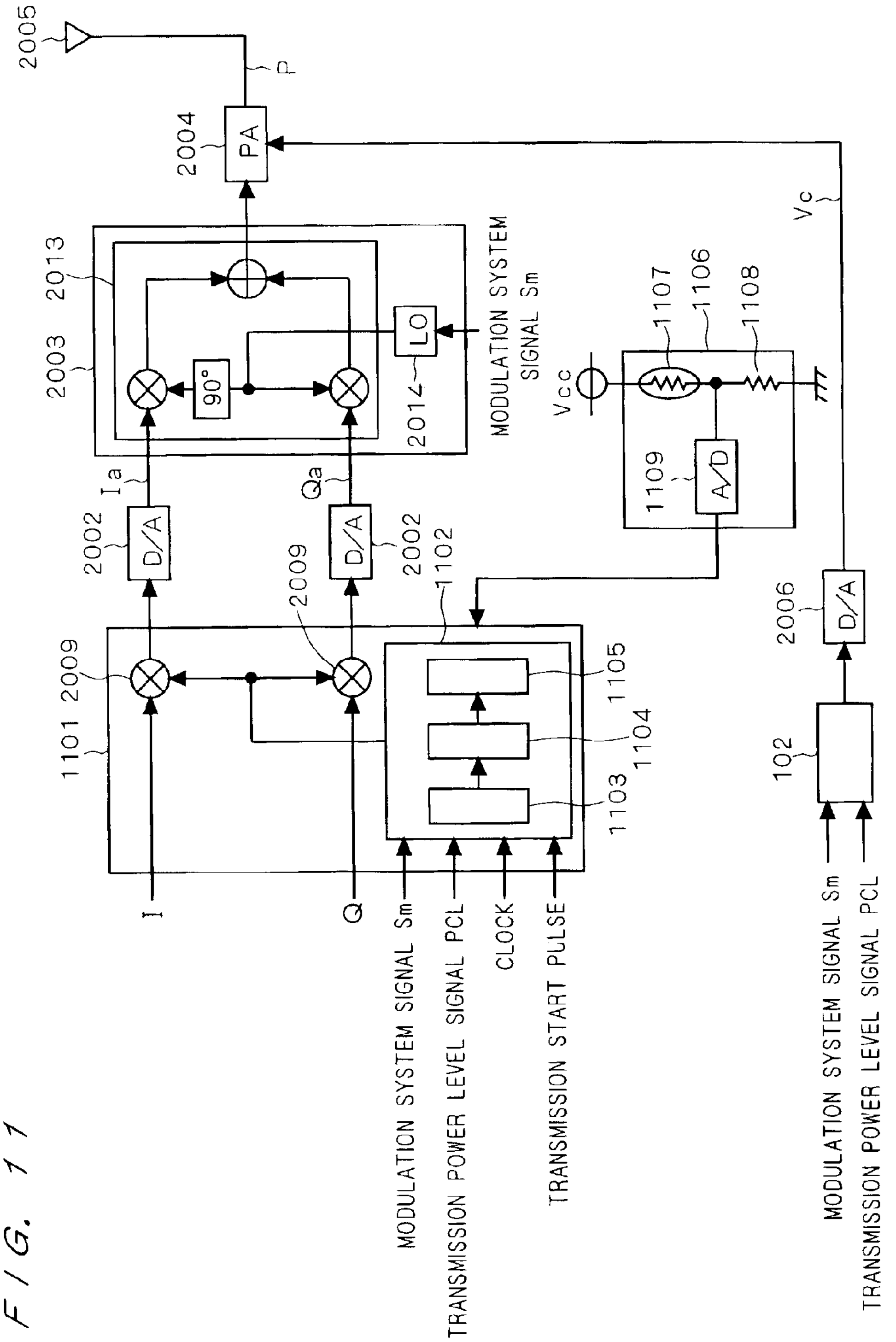
FIG. 11 is a functional block diagram showing a burst transmitter according to a fourth preferred embodiment of the invention.

FIG. 11 shows a dual-mode burst transmitter of a fourth preferred embodiment; the dual-mode burst transmitter uses an amplitude modulation system and a constant envelope modulation system (e.g. PDC and GSM). In FIG. 11, the reference numeral 1106 denotes a temperature detecting circuit for detecting the ambient temperature of the power amplifier 2004. The temperature detecting circuit 1106, provided near the power amplifier 2004, includes a thermistor 1107 whose resistance value varies with change in temperature, a resistor 1108 connected in series with the thermistor 1107, and a temperature measuring A/D converter 1109 connected to the connection point between the thermistor 1107 and the resistor 1108.

The reference numeral 1101 denotes an I/Q signal amplitude control unit including a waveform data generating portion 1102 and the multiplication mixers 2009. The waveform data generating portion 1102 of this preferred embodiment, like that of the second preferred embodiment, includes a counter 1103, a table reference number generating portion 1104, and a ramp amplitude waveform data memory 1105. The waveform data generating portion 1102 receives as its input the temperature information from the temperature detecting circuit 1106, as well as the modulation system signal Sm and the transmission power level signal PCL. The ramp amplitude waveform data memory 1105 stores a plurality of ramp amplitude waveforms VGiq so that the rise time Ta and the fall time Tc of the baseband signals can be selected in accordance with the modulation system signal Sm, the transmission power level signal PCL, and the temperature information. Accordingly, as compared with the table reference number generating portion 604, the table reference number generating portion 1104 in the waveform data generating portion 1102 operates on the basis of a more variety of conditions. As for the temperature detecting circuit 1106 shown in FIG. 11, a processor etc., e.g. a CPU, may be connected in a stage that follows the temperature measuring A/D converter 1109, and then, for example, the temperature can be measured several times and the digital data can be averaged before being fed to the waveform data generating portion 1102. In other respects the configuration is the same as that shown in FIG. 6 of the second preferred embodiment and therefore not described again.

Its operation is described next. During transmission, the power amplifier 2004 operates at high output power and therefore it generates heat when the transmission lasts long in time. Also, the temperature varies depending on the environment where the radio transmitter is used. In such a case, the distortion characteristic varies in accordance with the temperature characteristic of the power amplifier 2004 and then the transmission output P cannot be slowly ramped up and down, causing the spreading of the spectrum. It is therefore necessary to consider the temperature of the power amplifier 2004 during operation.

First, as for the operation of the temperature detecting circuit 1106, a power-supply voltage controlled to be a constant voltage is divided between the thermistor 1107 and the resistor 1108 and the output voltage value is converted to digital data in the temperature detecting A/D converter 1109, which is sent to the waveform data generating portion 1102; the temperature can thus be detected.

Next the operation of the I/Q signal amplitude control unit 1101 is described. In this preferred embodiment, an optimum ramp amplitude waveform Viq is selected as the waveform of the analog baseband signals Ia and Qa which are ramped on the basis of the temperature information from the temperature detecting circuit 1106. This allows the transmission output P to exhibit a smooth envelope and prevents the spreading of spectrum. FIG. 12 shows ramp amplitude waveforms VGiq that can be selected on the basis of the temperature information when the constant envelope modulation is used and the transmission power level signal PCL indicates level 2, where the values of Ta, Tb and Tc are shown with the transmission slot time assumed to be 1.00. In this diagram, the stored ramp amplitude waveforms VGiq include four groups of waveforms in accordance with the transmission power level signal PCL and each group includes three versions in accordance with the temperature information; 12 ramp amplitude waveforms VGiq are thus stored. When the temperature is higher, the nonlinearity of the power amplifier 2004 is stronger, so that the rise time Ta and the fall time Tc are set longer than when the temperature is lower so as to cause the waveform to rise and fall slowly, thereby preventing the spreading of spectrum. While this diagram shows an example in the case of the constant envelope modulation, the distortion due to temperature occurs also when the amplitude modulation is used. It is therefore desirable to ramp the digital baseband signals I and Q to a suitable degree on the basis of the temperature information also when the amplitude modulation is used. When the amplitude modulation is used, the ramping process can be performed in a fixed way irrespective of the transmission power level signal PCL. Accordingly, the ramp process may include three levels depending on the temperature information, using three sets of stored ramp amplitude waveforms VPiq. In other respects the operation is the same as that of the second preferred embodiment and therefore not described again.

Fifth Preferred Embodiment

Figure 13:
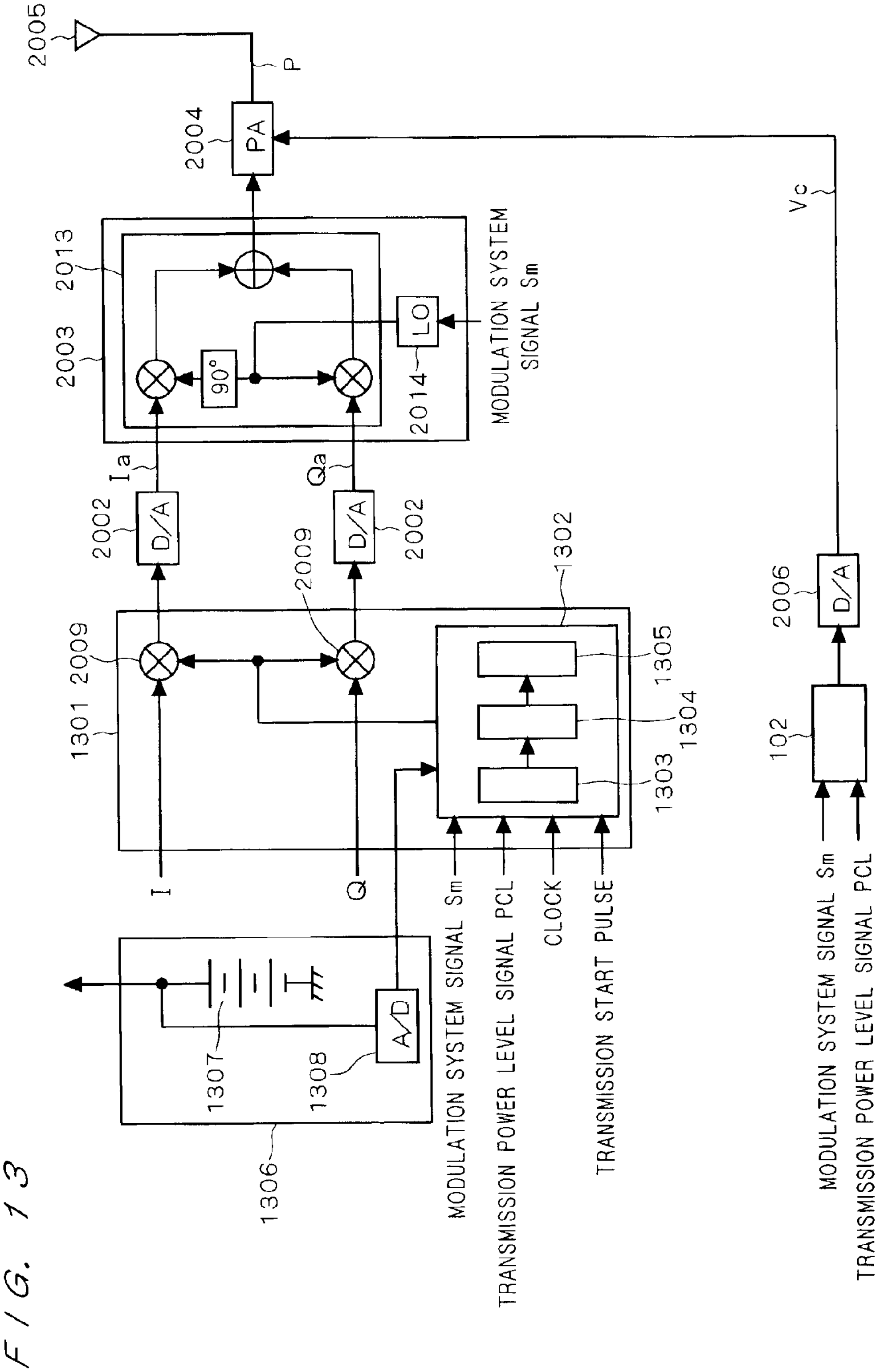
FIG. 13 is a functional block diagram showing a burst transmitter according to a fifth preferred embodiment of the invention.

FIG. 13 shows a dual-mode burst transmitter according to a fifth preferred embodiment; the dual-mode burst transmitter uses an amplitude modulation system and a constant envelope modulation system (e.g. PDC and GSM). In FIG. 13, the reference numeral 1306 denotes a power-supply voltage detecting circuit for detecting the voltage of the battery, i.e. the power-supply voltage. The power-supply voltage detecting circuit 1306 includes a power-supply battery 1307 and a power-supply voltage A/D converter 1308. The reference numeral 1301 indicates an I/Q signal amplitude control unit which includes a waveform data generating portion 1302 and the multiplication mixers 2009. The waveform data generating portion 1302, like that of the second preferred embodiment, includes a counter 1303, a table reference number generating portion 1304, and a ramp amplitude waveform data memory 1305. The waveform data generating portion 1302 receives as its input the power-supply voltage information from the power-supply voltage detecting circuit 1306, as well as the modulation system signal Sm and the transmission power level signal PCL. The ramp amplitude waveform data memory 1305 stores a plurality of ramp amplitude waveforms Viq so that the rise time Ta and the fall time Tc of the analog baseband signals Ia and Qa can be selected in accordance with the modulation system signal Sm, the transmission power level signal PCL, and the power-supply voltage information. Accordingly, as compared with the table reference number generating portion 604, the table reference number generating portion 1304 in the waveform data generating portion 1302 operates on the basis of a more variety of conditions. As for the power-supply voltage detecting circuit 1306 shown in FIG. 13, the digital power-supply voltage information may be averaged in a processor, e.g. a CPU, and then fed to the waveform data generating portion 1302, for example. In other respects the configuration is the same as that shown in FIG. 6 of the second preferred embodiment and therefore not described again.

Its operation is now described. In a battery-driven radio apparatus, the power-supply for the power amplifier 2004 is often directly supplied from the battery in order to efficiently output the transmission output P. The battery voltage greatly varies depending on the amount of the remaining electricity. In such a case, the distortion characteristic varies in accordance with the power-supply voltage characteristic of the power amplifier, and then the transmission output P cannot exhibit a smooth waveform, leading to the spreading of spectrum. It is therefore necessary to consider the power-supply voltage information.

First, the power-supply voltage detecting circuit 1306 is described. The power-supply voltage is detected by converting an analog voltage value of the battery 1307 into digital data in the power-supply voltage A/D converter 1308. The signal thus detected is fed to the waveform data generating portion 1302. Then an optimum ramp amplitude waveform Viq is selected on the basis of the voltage information from the power-supply voltage detecting circuit 1306. This allows the transmission output P to exhibit a smooth waveform and prevents the spectrum from spreading. By way of example, FIG. 14 shows ramp amplitude waveforms VGiq that can be selected on the basis of the power-supply voltage information when the constant envelope modulation is used and the transmission power level signal PCL indicates level 2. FIG. 14 shows the ratio among the rise time Ta, the fall time Tc, and the burst transmission section Tb of the analog baseband signals Ia and Qa with the transmission slot time assumed to be 1.00. In this diagram, the stored ramp amplitude waveforms VGiq include four groups of waveforms in accordance with the transmission power level signal PCL and each group includes three versions in accordance with the power-supply voltage information; 12 ramp amplitude waveforms VGiq are thus stored. While this diagram shows an example in the case of the constant envelope modulation, such distortion occurs in the same way in the amplitude modulation when a burst transmitter using battery voltage is used. It is therefore desirable to ramp the baseband signals I and Q to a suitable degree on the basis of the power-supply voltage information also when the amplitude modulation is selected. When the amplitude modulation is selected, the ramp process can be performed in a fixed way irrespective of the transmission power level signal PCL. Accordingly, the ramp process may involve three levels depending on the power-supply voltage information, using three sets of stored ramp amplitude waveforms VPiq. In other respects the operation is the same as that of FIG. 6 shown in the second preferred embodiment and therefore not described again.

Sixth Preferred Embodiment

Figure 15:
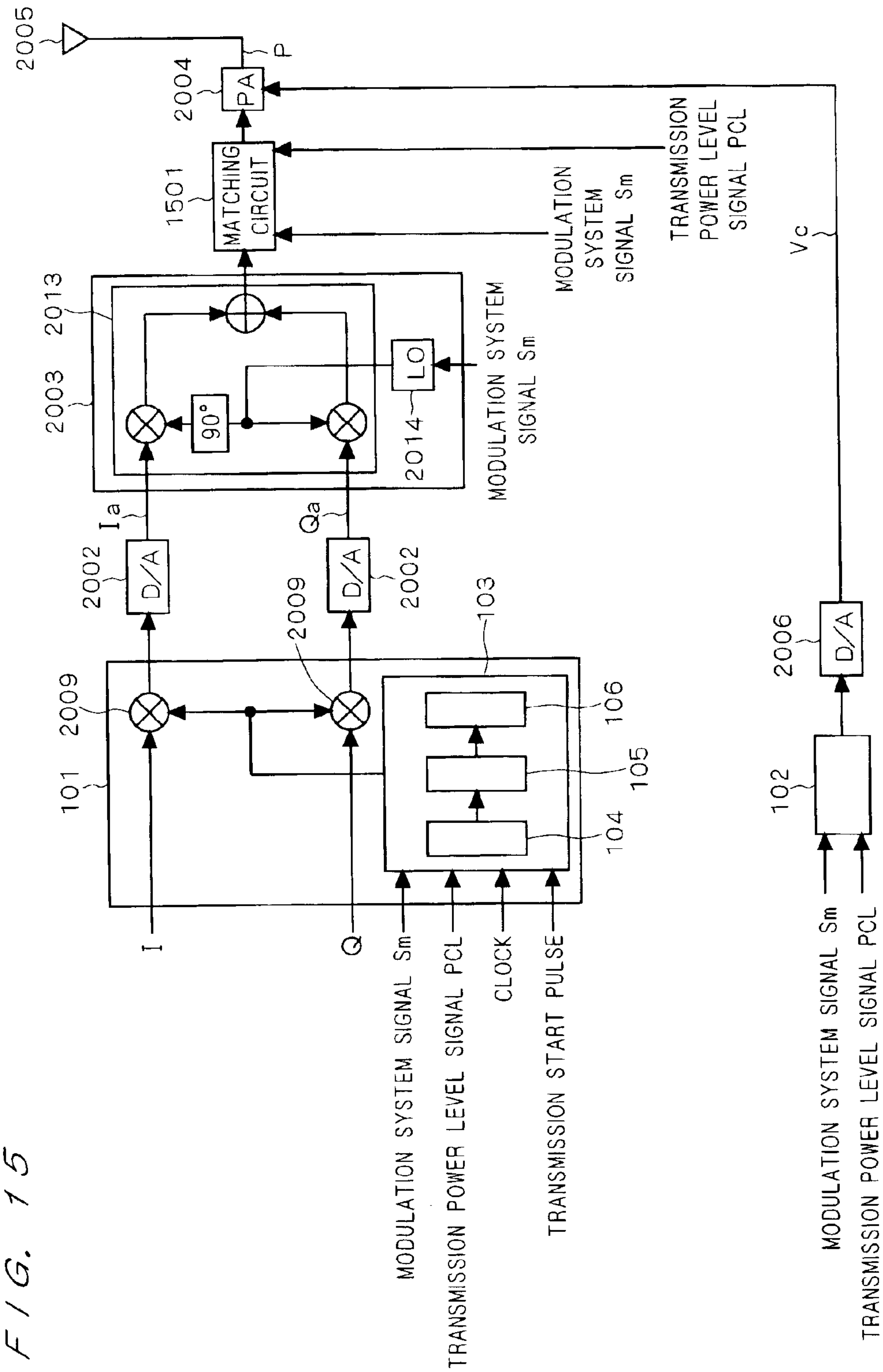
FIG. 15 is a functional block diagram showing a burst transmitter according to a sixth preferred embodiment of the invention.

FIG. 15 is a block diagram showing a dual-mode burst transmitter according to a sixth preferred embodiment; the dual-mode burst transmitter uses an amplitude modulation system and a constant envelope modulation system (e.g. PDC and GSM). In this diagram, the reference numeral 1501 denotes an electric matching adjusting circuit connected in the stage that precedes the power amplifier 2004; when the nonlinearity in the burst transmitter becomes stronger during the amplitude modulation or constant envelope modulation, the electric matching adjusting circuit 1501 corrects it. As shown in the specific circuit diagram in FIG. 16, the electric matching adjusting circuit 1501 includes a select signal generating portion 1601 receiving the modulation system signal Sm and the transmission power level signal PCL and generating a select signal, a parallel circuit of a coil 1602 and a capacitor 1604, and switches 1603 for switching between the coil and the capacitor with the select signal. The select signal may be generated in a processor, e.g. a CPU. While the electric matching adjusting circuit 1501 is connected in a stage that precedes the power amplifier 2004 in the diagram, it may be connected in a stage that follows the power amplifier 2004. In other respects the configuration is the same as that shown in FIG. 1 of the first preferred embodiment and therefore not described again.

Next its operation is described. The digital baseband signals I and Q are ramped in the I/Q signal amplitude control unit 101 and are converted to analog signals in the baseband signal D/A converters 2002. Next, in the modulating unit 2003, the quadrature modulator 2013 quadrature-modulates the analog baseband signals Ia and Qa with a high-frequency signal outputted from the local oscillator 2014 to produce a high-frequency signal for transmission. The high-frequency signal outputted from the local oscillator 2014 has a frequency that is used in the modulation system based on the modulation system signal Sm sent from the base station. The transmission high-frequency signal modulated in the modulating unit 2003 is fed to the electric matching adjusting circuit 1501 before being fed to the power amplifier 2004. Nonlinearity may occur as a result of a high output power transmission regardless of the modulation system. Accordingly, the power level of the transmission output P which will cause nonlinearity is previously examined and adjustment is made so that an expected value will be attained as a result of the distortion. The previously adjusted transmission high-frequency signal is amplified in the power amplifier 2004 and transmitted from the antenna 2005 as the transmission output P. In this process, the modulation system signal Sm and the transmission power level signal PCL are provided to the control voltage signal selecting unit 102, and digital data corresponding to the level of the transmission power level signal PCL is sent to the control voltage signal D/A converter 2006. The control voltage signal D/A converter 2006 converts the digital data to an analog signal, which controls the power amplifier 2004 as the power amplifier control voltage Vc.

Figures 16, 17:
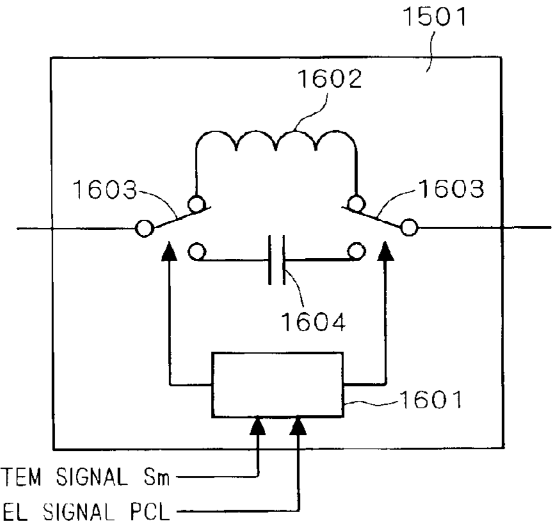
FIG. 16 is a functional block diagram showing an electric matching adjusting circuit used in the sixth preferred embodiment of the invention.
FIG. 17 is a diagram showing a circuit select signal which is determined on the basis of the modulation system signal and the transmission power level signal in the sixth preferred embodiment.

Next, the operation of the electric matching adjusting circuit 1501 is described in more detail. In the electric matching adjusting circuit 1501, the select signal generating portion 1601 generates its select signal on the basis of the modulation system signal Sm and the transmission power level signal PCL. FIG. 17 shows the criteria for generating the select signal. When the power of the transmission output P is high, the nonlinearity of the power amplifier 2004 increases and then the transmission output P cannot exhibit a smooth waveform, and the spectrum spreads. Accordingly "1" is outputted when the transmission output P has higher power (when the transmission power level signal PCL indicates a lower level) and "0" is outputted when the power is lower. In FIG. 17, even if the transmission power level signal PCL has different numbers of levels in the amplitude modulation system and the constant envelope modulation system, the level of the transmission power level signal PCL is determined to be large or small on the basis of whether it belongs to the higher half or the lower half, and 1 is outputted when its is small and 0 is outputted when it is large.

Next, as an example of the electric matching adjusting circuit 1501 which makes the selection with the select signal, when the power of the transmission output P is high and the nonlinearity can be decreased by applying inductive reactance to the line, the switch 1603 selects the coil 1602 with the select signal=1. On the other hand, when the power of the transmission output P is low and the nonlinearity can be decreased by applying capacitive reactance to the line, the capacitor 1604 is selected with the select signal=0.

The power of the transmission output P is determined by the transmission power level signal PCL. Hence, while I/Q amplitude control is performed, the electric matching adjusting circuit 1501 connected to the power amplifier 2004 is controlled in accordance with the modulation system signal Sm and the transmission power level signal PCL, so as to reduce the nonlinearity of the power amplifier 2004 and smooth the waveform of the transmission output P, and thus to prevent the spreading of the spectrum. While in this example the sixth preferred embodiment has been applied to the first preferred embodiment shown in FIG. 1, this preferred embodiment can be applied also to the preferred embodiments shown in FIGS. 6, 11 and 13 to obtain the same effects.

Seventh Preferred Embodiment

Figure 18:
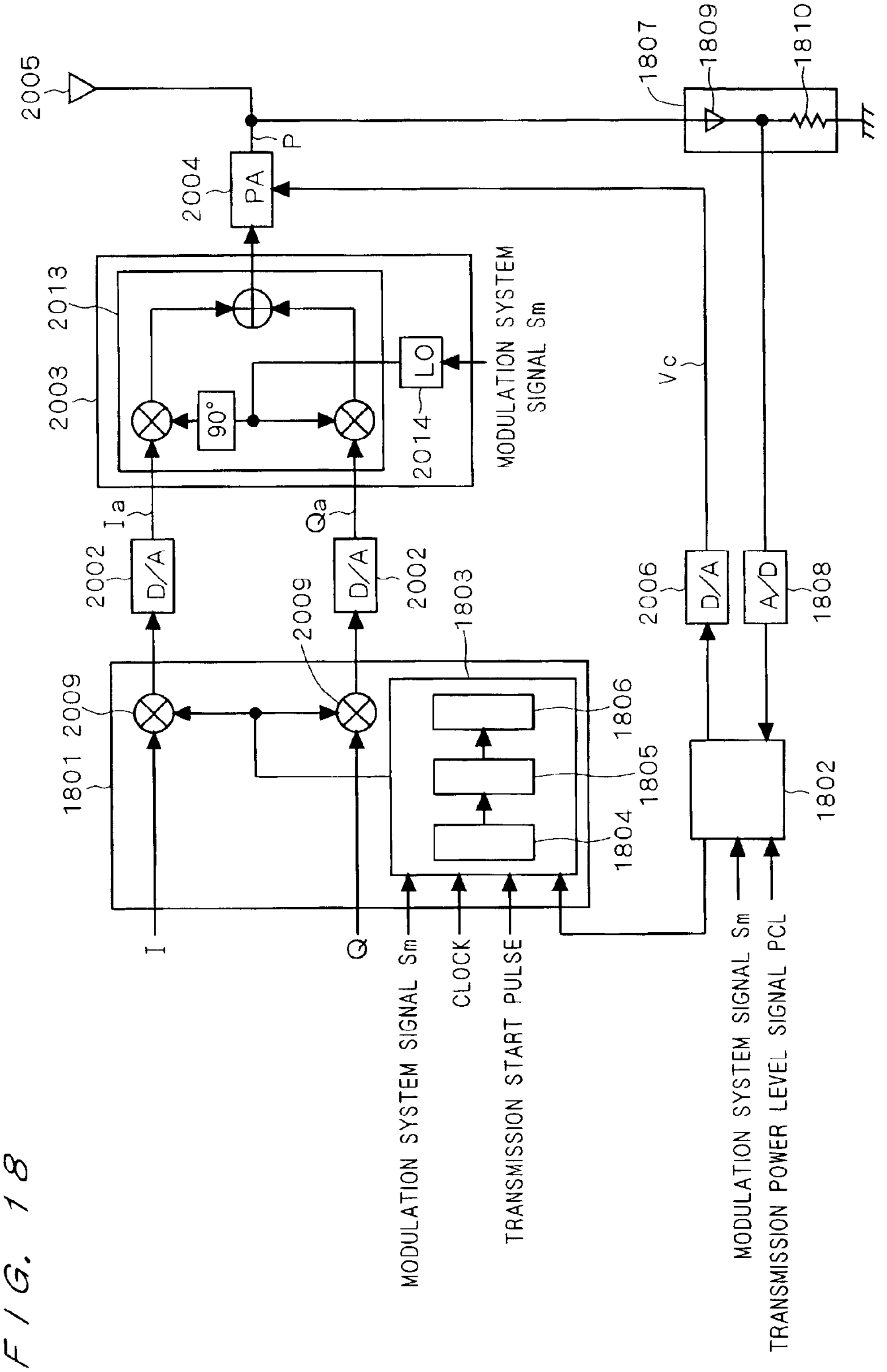
FIG. 18 is a functional block diagram showing a burst transmitter according to a seventh preferred embodiment of the invention.
Figure 20:
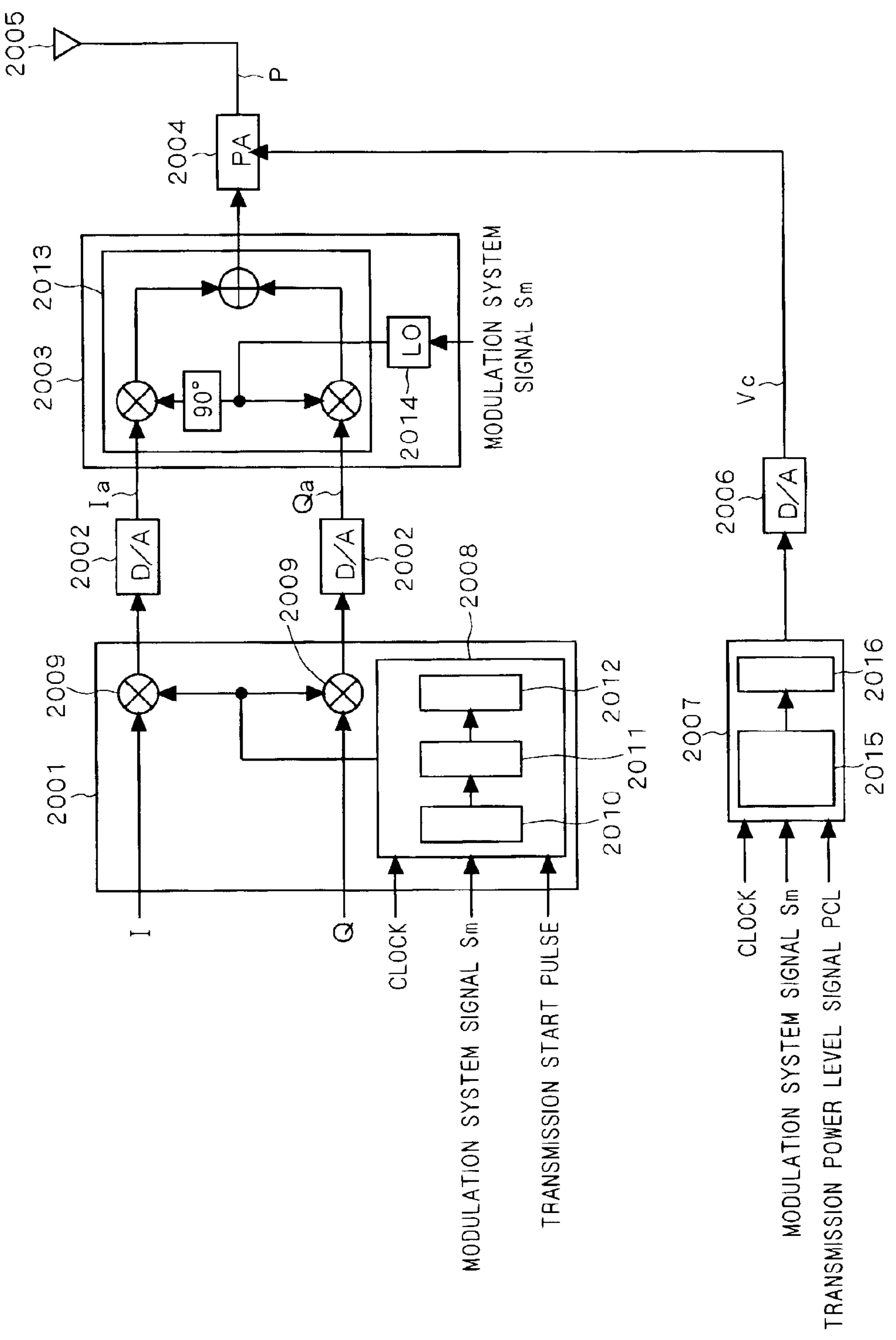
FIG. 20 is a functional block diagram showing a conventional burst transmitter.
Figure 21A:
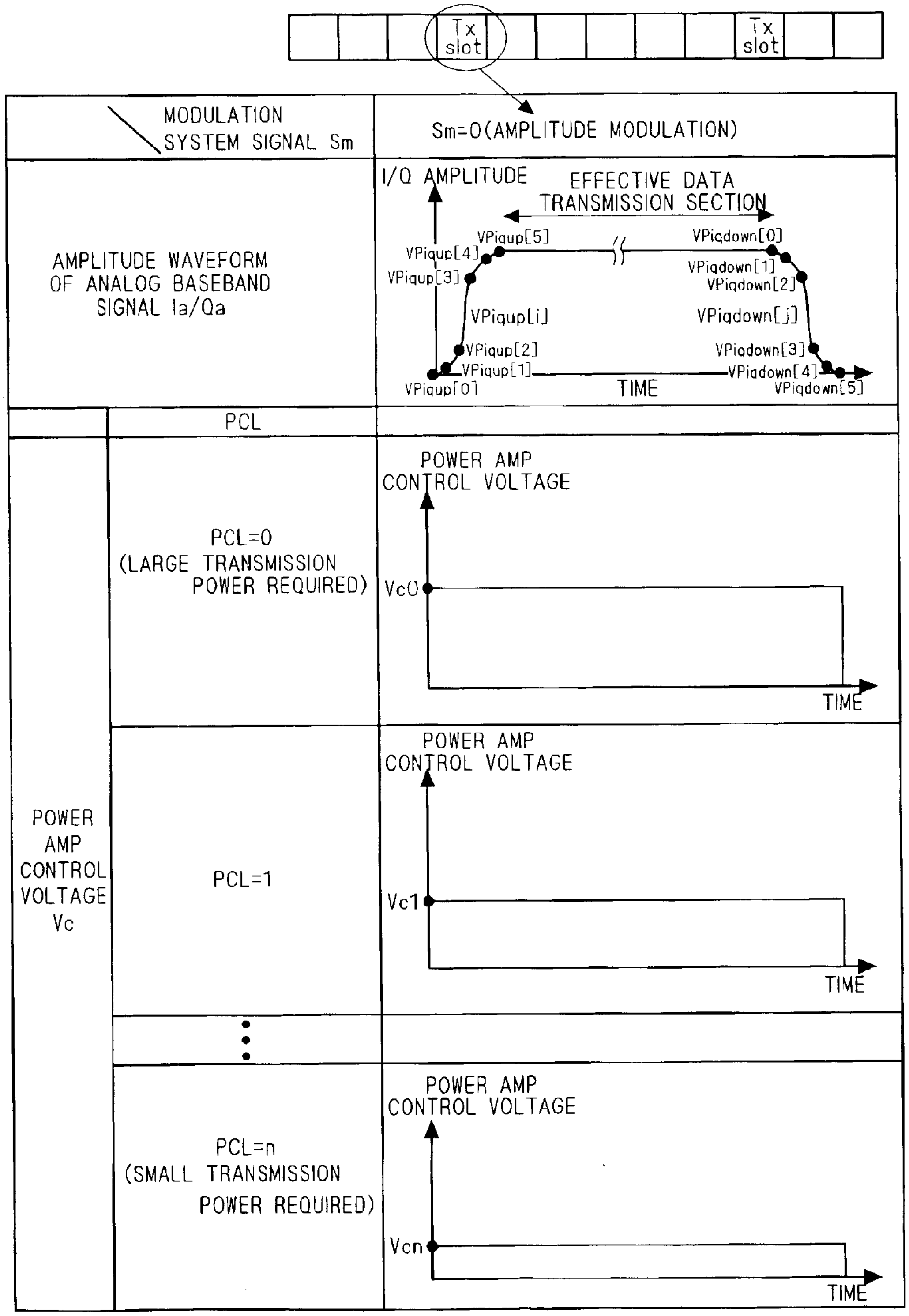
FIGS. 21A and 21B are diagrams showing amplitude waveforms of an analog baseband signal ramped in the conventional I/Q signal amplitude control unit and the control voltage to the power amplifier.
Figure 21B:
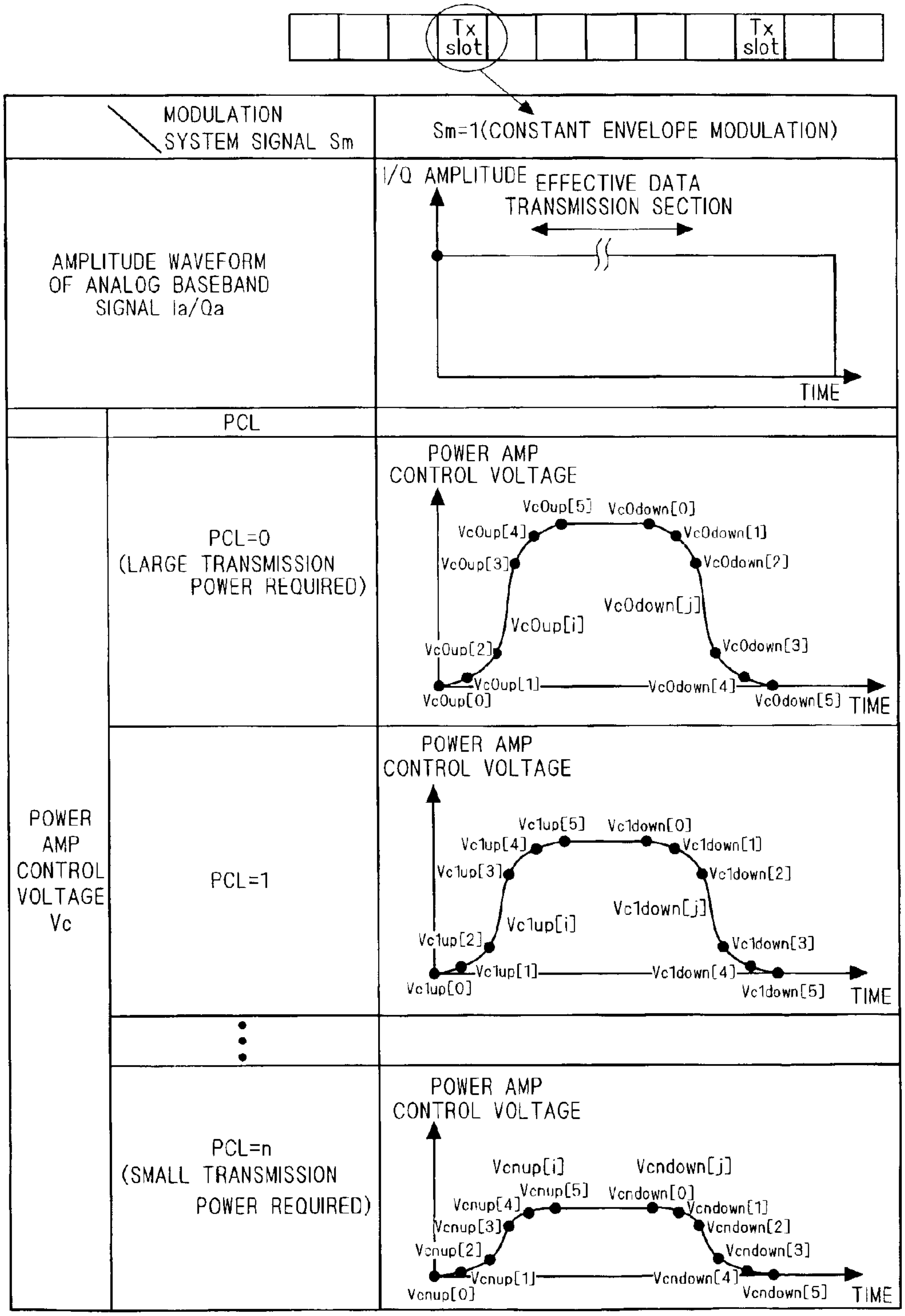
Figure 22:
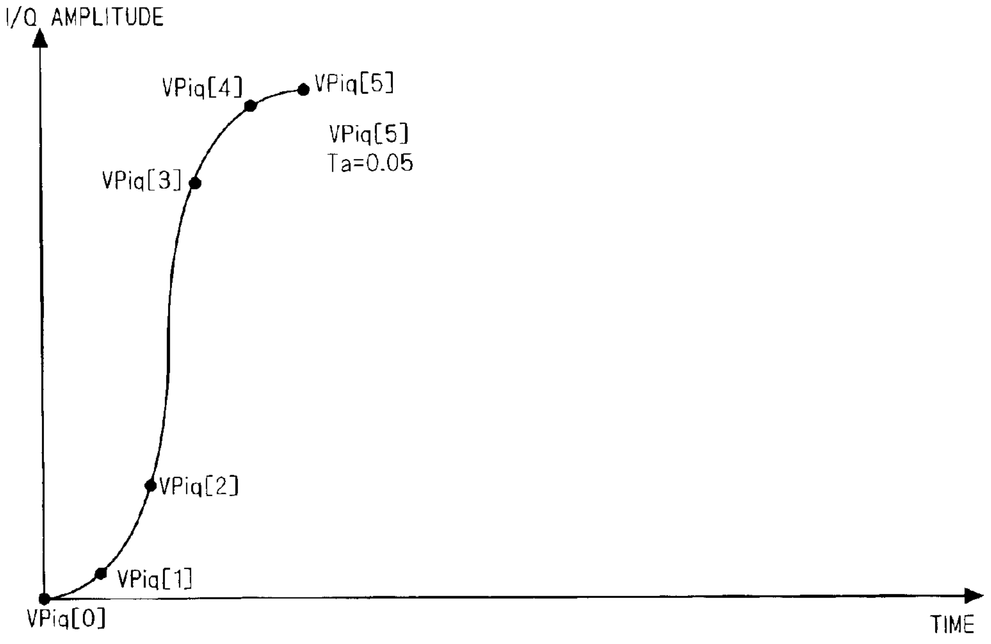
FIG. 22 is a diagram showing as an analog signal a ramp amplitude waveform selected in the conventional I/Q signal amplitude control unit.

FIG. 18 is a block diagram showing a dual-mode burst transmitter according to a seventh preferred embodiment; this dual-mode burst transmitter uses an amplitude modulation system and a constant envelope modulation system (e.g. PDC and GSM). In FIG. 18, the reference numeral 1807 denotes a detector circuit which converts the transmission output P into a DC voltage; part of the transmission output P is fed to a diode 1809, with the connection point between the diode 1809 and a resistor 1810 providing the output of the detector circuit 1807. The reference numeral 1808 denotes a detector circuit A/D converter which converts the output from the detector circuit 1807 into digital data; the output of the detector circuit A/D converter 1808 is inputted to a processor 1802 in the signal processing unit. The processor 1802 calculates the input-output nonlinearity of the power amplifier 2004 on the basis of the transmission power level signal PCL, the control voltage signal Vc, and the output from the detector circuit 1807, and then it sends the calculated nonlinearity information to the I/Q signal amplitude control unit 1801, while it also sends the digital control voltage data to the control voltage signal D/A converter 2006. While, in FIG. 18, the function of calculating the input-output nonlinearity of the power amplifier 2004 and the function of selecting the control voltage signal are conducted in one place, these functions may be provided separately. When a CPU is used as the processor 1802, for example, the nonlinearity can be measured several times and averaged, and then the calculated result can be provided as the output.

The I/Q signal amplitude control unit 1801 includes a waveform data generating portion 1803 and the multiplication mixers 2009. The waveform data generating portion 1803 of this preferred embodiment, like that of the second preferred embodiment, includes a counter 1804, a table reference number generating portion 1805, and a ramp amplitude waveform data memory 1806. The waveform data generating portion 1803 receives as its input the nonlinearity calculated by the processor 1802, as well as the modulation system signal Sm and the transmission power level signal PCL. The ramp amplitude waveform data memory 1806 stores values of the rise time Ta and the fall time Tc for the baseband signals in correspondence with the degree of nonlinearity. The table reference number generating portion 1805 in the waveform data generating portion 1803 therefore operates on the basis of a more variety of conditions than the table reference number generating portion 604. In other respects the configuration is the same as that shown in FIG. 6 of the second preferred embodiment and therefore not described again.

Next, the operation is described. At the beginning of transmission, on the basis of the modulation system signal Sm and the transmission power level signal PCL specified by the radio system (e.g. by the base station), the processor 1802 outputs, to the control voltage signal D/A converter 2006, previously prepared digital control voltage data that corresponds to the target power of the transmission output P. The control voltage signal D/A converter 2006 then converts the digital data to an analog signal, which controls the power amplifier 2004 as the control voltage Vc.

Also, at the beginning of transmission, the digital baseband signals I and Q are ramped by using a ramp amplitude waveform Viq that corresponds to the modulation system signal Sm and the transmission power level signal PCL. After the transmission has started, the transmission output P is converted to a DC voltage in the detector circuit 1807, converted to digital data in the detector signal A/D converter 1808, and provided as an input to the processor 1802.

The processor 1802 then performs feedback control to adjust the control voltage Vc to the power amplifier 2004 so as to make the detected power of the transmission output P come equal to the target power of the transmission output P; the target power of the transmission output P is thus attained finally.

Then, the processor 1802 calculates the difference ΔV between the value of the control voltage Vci to the power amplifier 2004 (used at the beginning of the transmission), which had been previously prepared for the power value of the transmission output P, and the value of the control voltage Vcf with which the target power of the transmission output P was attained finally:

$$\Delta V = Vcf - Vci$$

Then, for example, if ΔV is plus, and there is a relation in which the power of the transmission output P becomes high when the control voltage Vc to the power amplifier 2004 is high, then it is determined that the power amplifier 2004 is close to the saturation state and the nonlinearity is large. When the nonlinearity is large, the processor 1802 signals the waveform data generating portion 1803 to cause the I/Q signal amplitude control unit 1801 to ramp the waveform so that it more slowly rises and falls: the digital baseband signals I and Q are thus controlled. FIG. 19 shows an example of ramp amplitude waveforms VGiq prepared in accordance with the degree of ΔV (=nonlinearity). FIG. 19 shows the ratio among the rise time Ta, fall time Tc, and burst transmission section Tb of the analog baseband signals Ia and Qa with the transmission slot time assumed to be 1.00. While the diagram shows an example in the case of the constant envelope modulation, ramp amplitude waveforms VPiq may be prepared considering the nonlinearity of the amplifier also in the amplitude modulation. In other respects the operation is the same as that shown in FIG. 6 of the second preferred embodiment and therefore not described again.

As shown above, the transmission output P is detected and fed back so that the nonlinearity of the power amplifier 2004 can be quantitatively grasped and the waveform of the transmission output P can be most appropriately controlled, so as to prevent the spreading of the spectrum during transmission.

While the first to seventh preferred embodiments have described a dual-mode burst transmitter, the same effects can be obtained with ones which use only a constant envelope modulation system.

Eighth Preferred Embodiment

The technique of the invention can be utilized when the burst transmitter described in the first to seventh preferred embodiments is a mobile device and the modulation system is changed when it moves in a radio network from a cell in which an amplitude modulation is used into a cell in which a constant envelope modulation is used, or from a cell in which a constant envelope modulation is used into a cell in which an amplitude modulation is used.

While the invention has been described in detail, the foregoing description is in all aspects illustrative and not restrictive. It is understood that numerous other modifications and variations can be devised without departing from the scope of the invention.

What is claimed is:

1. A transmission output power control device for use in a burst transmitter using a constant envelope modulation system, comprising:

an I/Q signal amplitude control portion for variably controlling the shape of a rise and a fall of a waveform of a baseband signal and its burst transmission time from the end of the rise to the beginning of the fall;

a modulator for modulating said baseband signal controlled in said I/Q signal amplitude control portion into a high-frequency signal;

an amplifier for amplifying said high-frequency signal modulated in said modulator; and control voltage signal selecting means for outputting a predetermined constant voltage which is determined by a transmission power level signal, so as to control an output power of said amplifier.

2. The transmission output power control device according to claim 1, wherein when the constant envelope modulation is used, said I/Q signal amplitude control portion variably controls the shape of the rise and the fall of the waveform of the baseband signal and the burst transmission time from the end of the rise to the beginning of the fall in accordance with said transmission power level signal.

3. The transmission output power control device according to claim 1, further comprising temperature measuring means for measuring a temperature of said amplifier, wherein said I/Q signal amplitude control portion variably controls the shape of the rise and the fall of the waveform of the baseband signal and the burst transmission time from the end of the rise to the beginning of the fall in accordance with a temperature signal obtained by said temperature measuring means.

4. The transmission output power control device according to claim 1, further comprising power-supply voltage measuring means for measuring a power-supply voltage, wherein said I/Q signal amplitude control portion variably controls the shape of the rise and the fall of the waveform of the baseband signal and the burst transmission time from the end of the rise to the beginning of the fall in accordance with a power-supply voltage signal obtained by said power-supply voltage measuring means.

5. The transmission output power control device according to claim 1, further comprising an electric matching adjusting circuit connected in a stage which precedes or follows said amplifier, for lessening nonlinearity of said amplifier.

6. A transmission output power control device for use in a dual-mode burst transmitter using a constant envelope modulation system and an amplitude modulation system, comprising:

an I/Q signal amplitude control portion for variably controlling the shape of a rise and a fall of a waveform of a baseband signal and its burst transmission time from the end of the rise to the beginning of the fall in accordance with a modulation system signal;

a modulator for modulating the baseband signal controlled in said I/Q signal amplitude control portion into a high-frequency signal in accordance with said modulation system signal;

an amplifier for amplifying said high-frequency signal modulated in said modulator; and control voltage signal selecting means for outputting a predetermined constant voltage which is determined by said modulation system signal and a transmission power level signal, so as to control an output power of said amplifier.

7. The transmission output power control device according to claim 6, wherein when the constant envelope modulation is used, said I/Q signal amplitude control portion variably controls the shape of the rise and the fall of the waveform of the baseband signal and the burst transmission time from the end of the rise to the beginning of the fall in accordance with said transmission power level signal.

8. The transmission output power control device according to claim 6, wherein when the amplitude modulation is used, said I/Q signal amplitude control portion fixedly controls the shape of the rise and the fall of the waveform of the baseband signal and the burst transmission time from the end of the rise to the beginning of the fall, and when the constant envelope modulation is used, said I/Q signal amplitude control portion variably controls the shape of the rise and the fall of the waveform of the baseband signal and the burst transmission time from the end of the rise to the beginning of the fall in accordance with said transmission power level signal.

9. The transmission output power control device according to claim 6, further comprising temperature measuring means for measuring a temperature of said amplifier, wherein said I/Q signal amplitude control portion variably controls the shape of the rise and the fall of the waveform of the baseband signal and the burst transmission time from the end of the rise to the beginning of the fall in accordance with a temperature signal obtained by said temperature measuring means.

10. The transmission output power control device according to claim 6, further comprising power-supply voltage measuring means for measuring a power-supply voltage, wherein said I/Q signal amplitude control portion variably controls the shape of the rise and the fall of the waveform of the baseband signal and the burst transmission time from the end of the rise to the beginning of the fall in accordance with a power-supply voltage signal obtained by said power-supply voltage measuring means.

11. The transmission output power control device according to claim 6, further comprising an electric matching adjusting circuit connected in a stage which precedes or follows said amplifier, for lessening nonlinearity of said amplifier.

12. A transmission output power control device for use in a dual-mode burst transmitter using a constant envelope modulation system and an amplitude modulation system, comprising:

an I/Q signal amplitude control portion for controlling the shape of a rise and a fall of a waveform of a baseband signal and its burst transmission time from the end of the rise to the beginning of the fall in accordance with a modulation system signal;

a modulator for modulating said baseband signal controlled in said I/Q signal amplitude control portion into a high-frequency signal in accordance with said modulation system signal;

an amplifier for amplifying said high-frequency signal modulated in said modulator;

a detector for detecting an transmission output power outputted from said amplifier; and a signal processing portion for outputting a control voltage to said amplifier in accordance with a signal from said detector in such a way as to make said transmission output power attain a target output power, obtaining a difference between a target control voltage and said control voltage with which said transmission output power attained said target output power, and controlling said I/Q signal amplitude control portion so that the shape of the rise and the fall of the waveform of said baseband signal and the burst transmission time from the end of the rise to the beginning of the fall are varied in accordance with said difference.

* * * * *